(12) United States Patent
Hong et al.

(10) Patent No.: US 11,901,359 B2
(45) Date of Patent: Feb. 13, 2024

(54) METHOD OF MANUFACTURING A SEMICONDUCTOR DEVICE

(71) Applicant: SAMSUNG ELECTRONICS CO., LTD., Suwon-si (KR)

(72) Inventors: Seung Soo Hong, Suwon-si (KR); Jeong Yun Lee, Suwon-si (KR); Geum Jung Seong, Suwon-si (KR); Jin Won Lee, Suwon-si (KR); Hyun Ho Jung, Suwon-si (KR)

(73) Assignee: SAMSUNG ELECTRONICS CO., LTD, Suwon-si (KR)

( * ) Notice: Subject to any disclaimer, the term of this patent is extended or adjusted under 35 U.S.C. 154(b) by 36 days.

(21) Appl. No.: 17/521,011

(22) Filed: Nov. 8, 2021

(65) Prior Publication Data
US 2022/0059532 A1 Feb. 24, 2022

Related U.S. Application Data

(63) Continuation of application No. 16/739,357, filed on Jan. 10, 2020, now Pat. No. 11,189,615.

(30) Foreign Application Priority Data
Apr. 15, 2019 (KR) ........................ 10-2019-0043851

(51) Int. Cl.
*H01L 21/8234* (2006.01)
*H01L 27/088* (2006.01)
(Continued)

(52) U.S. Cl.
CPC .. *H01L 27/0886* (2013.01); *H01L 21/823418* (2013.01); *H01L 21/823431* (2013.01);
(Continued)

(58) Field of Classification Search
None
See application file for complete search history.

(56) References Cited

U.S. PATENT DOCUMENTS 8,703,557 B1 4/2014 Cai et al.
9,171,752 B1 10/2015 Wu et al.
(Continued)

FOREIGN PATENT DOCUMENTS

KR 10-2016-0056693 A 5/2016

*Primary Examiner* — Joseph C. Nicely
*Assistant Examiner* — Lamont B Koo
(74) *Attorney, Agent, or Firm* — Muir Patent Law, PLLC

(57) ABSTRACT

A semiconductor device including a plurality of active regions extending in a first direction on a substrate; a device isolation layer between the plurality of active regions such that upper portions of the plurality of active regions protrude from the device isolation layer; a first gate electrode and a second gate electrode extending in a second direction crossing the first direction and intersecting the plurality of active regions, respectively, on the substrate, the first gate electrode being spaced apart from the second gate electrode in the second direction; a first gate separation layer between the first gate electrode and the second gate electrode; and a second gate separation layer under the first gate separation layer and between the first gate electrode and the second gate electrode, the second gate separation layer extending into the device isolation layer in a third direction crossing the first direction and the second direction.

20 Claims, 26 Drawing Sheets

(51) Int. Cl.
    *H01L 27/02*         (2006.01)
    *H01L 29/66*         (2006.01)
    *H10B 10/00*         (2023.01)

(52) U.S. Cl.
    CPC ........ *H01L 21/823437* (2013.01); *H01L 21/823475* (2013.01); *H01L 21/823481* (2013.01); *H01L 27/0207* (2013.01); *H01L 29/66545* (2013.01); *H10B 10/12* (2023.02)

(56) References Cited

U.S. PATENT DOCUMENTS

| | | |
|---|---|---|
| 9,653,466 B2 | 5/2017 | Yang et al. |
| 9,799,570 B1 | 10/2017 | Cheng |
| 9,853,131 B1 | 12/2017 | Cheng et al. |
| 10,026,737 B1 | 7/2018 | Ching et al. |
| 2017/0222020 A1 | 8/2017 | Yu et al. |
| 2017/0345820 A1 | 11/2017 | Lin et al. |
| 2018/0033699 A1* | 2/2018 | Zhu .............. H01L 29/0649 |
| 2018/0019317 A1 | 3/2018 | Cheng et al. |
| 2018/0342526 A1 | 11/2018 | Tsuda |
| 2020/0066718 A1 | 2/2020 | Li et al. |

\* cited by examiner

METHOD OF MANUFACTURING A SEMICONDUCTOR DEVICE

CROSS-REFERENCE TO RELATED APPLICATIONS

This is a continuation application based on pending application Ser. No. 16/739,357, filed Jan. 10, 2020, the entire contents of which is hereby incorporated by reference.

Korean Patent Application No. 10-2019-0043851, filed on Apr. 15, 2019, in the Korean Intellectual Property Office, and entitled: "Semiconductor Devices," is incorporated by reference herein in its entirety.

BACKGROUND

1. Field

Embodiments relate to a semiconductor device.

2. Description of the Related Art

As demand for high performance, high speed, multifunctionality of semiconductor devices, or the like, is increased, a degree of integration of semiconductor devices is likewise increasing. In manufacturing a semiconductor element having a fine pattern, corresponding to a tendency for high integration of semiconductor devices, patterns having a fine width or a fine spacing distance may be implemented.

SUMMARY

The embodiments may be realized by providing a semiconductor device including a plurality of active regions extending in a first direction on a substrate; a device isolation layer between the plurality of active regions such that upper portions of the plurality of active regions protrude from the device isolation layer; a first gate electrode and a second gate electrode extending in a second direction crossing the first direction and intersecting the plurality of active regions, respectively, on the substrate, the first gate electrode being spaced apart from the second gate electrode in the second direction; a first gate separation layer between the first gate electrode and the second gate electrode; and a second gate separation layer under the first gate separation layer and between the first gate electrode and the second gate electrode, the second gate separation layer extending into the device isolation layer in a third direction crossing the first direction and the second direction.

The embodiments may be realized by providing a semiconductor device including a plurality of active regions extending in a first direction on a substrate; a first gate electrode and a second gate electrode extending in a second direction crossing the first direction and intersecting the plurality of active regions on the substrate, the first gate electrode being spaced apart from the second gate electrode in the second direction; and a gate separation portion between the first gate electrode and the second gate electrode, wherein the gate separation portion includes at least two layers stacked in a third direction, perpendicular to the first direction and the second direction, and having different widths.

The embodiments may be realized by providing a semiconductor device including a plurality of active regions extending in one direction; a dummy active region in parallel with the plurality of active regions; a first gate electrode and a second gate electrode intersecting the plurality of active regions and the dummy active region, the first gate electrode being spaced apart from the second gate electrode on a straight line; a first gate separation layer extending downwardly from upper surfaces of the first gate electrode and the second gate electrode, the first gate separation layer being between the first gate electrode and the second gate electrode; and a second gate separation layer under the first gate separation layer, the second gate separation layer being in contact with the first gate separation layer and the dummy active region.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
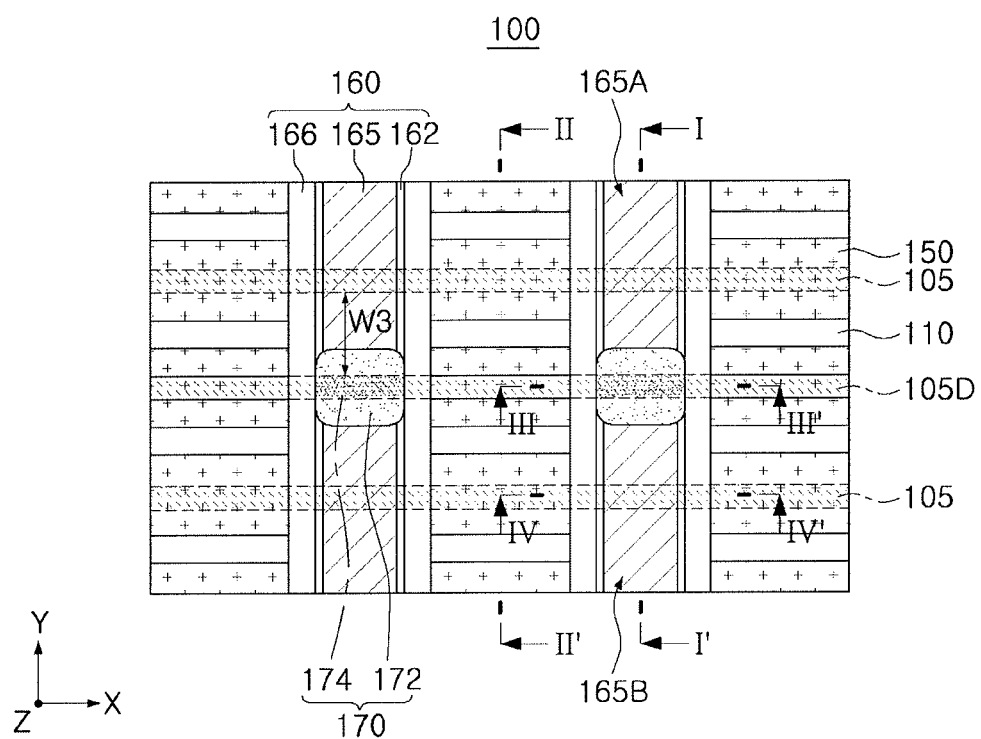
FIG. 1 illustrates a plan view of a semiconductor device according to example embodiments.
Figure 2A:
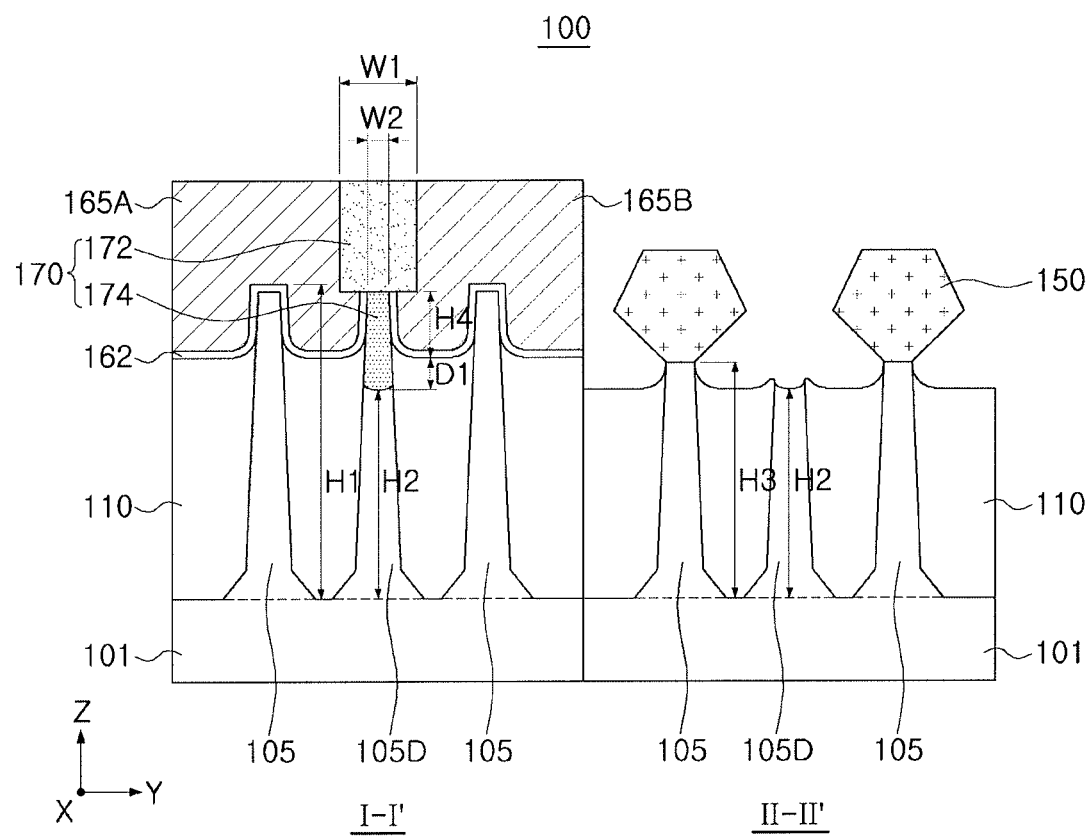
FIGS. 2A and 2B illustrate cross-sectional views of a semiconductor device according to example embodiments.
Figure 2B:
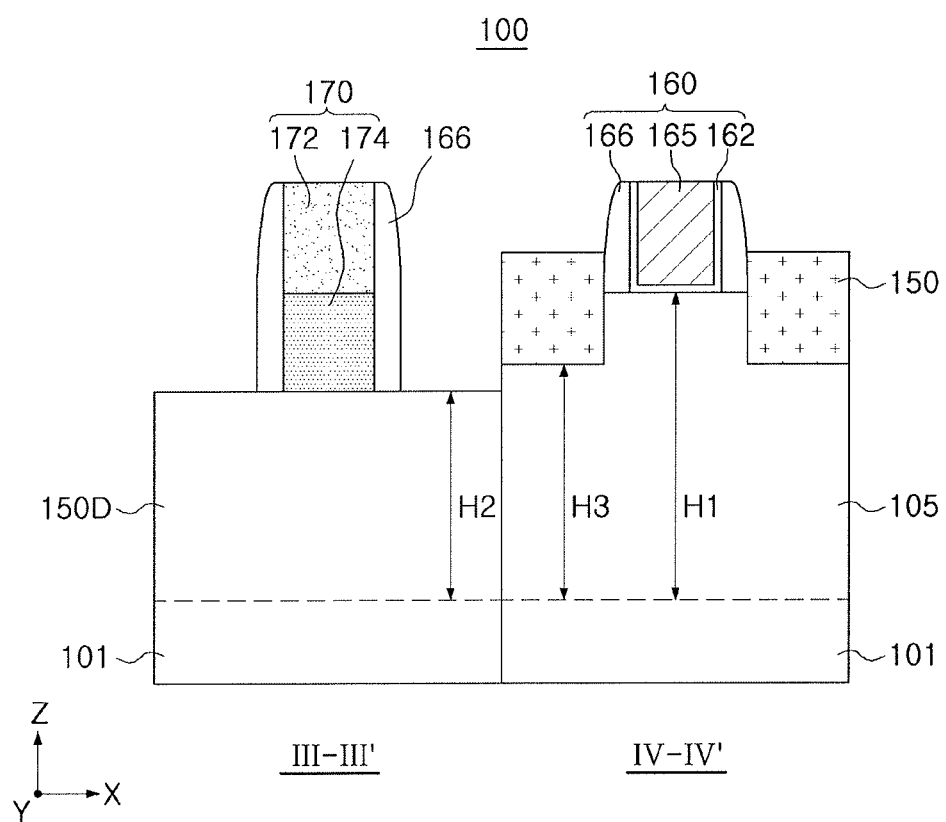
Figure 3:
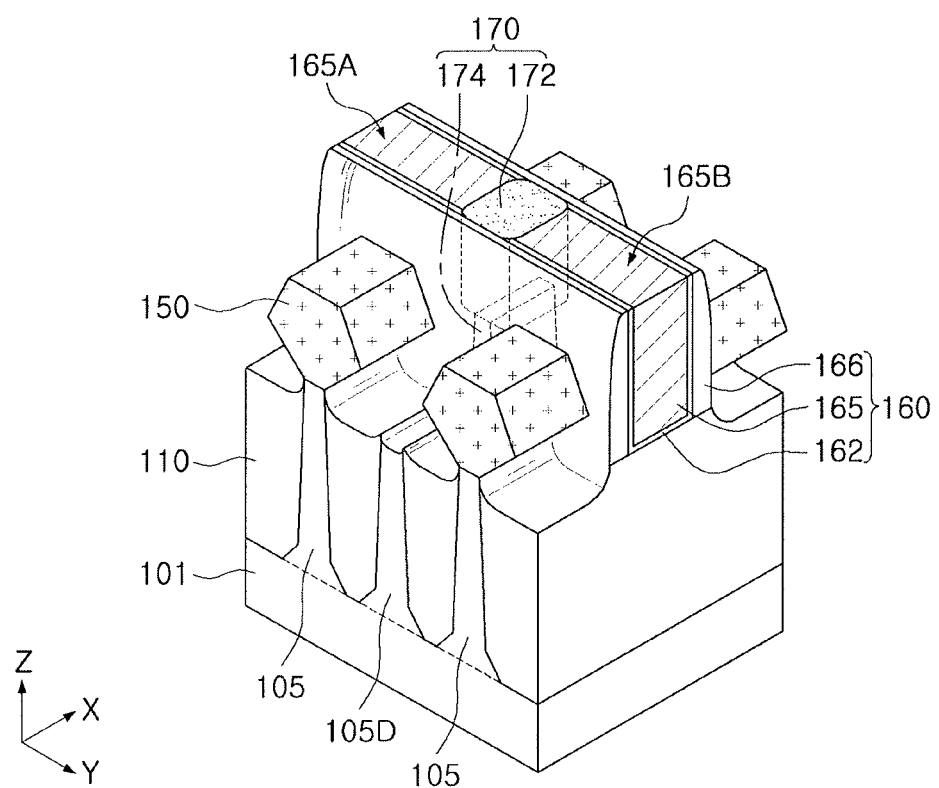
FIG. 3 illustrates a perspective view of a semiconductor device according to example embodiments.

FIG. 1 illustrates a plan view of a semiconductor device according to example embodiments. FIGS. 2A and 2B illustrate cross-sectional views of the semiconductor device of FIG. 1 along lines I-I' and II-II', and III-III' and IV-IV', respectively. FIG. 3 illustrates a perspective view of a portion of the semiconductor device of FIG. 1. For convenience of explanation, only major components of the semiconductor device are shown in FIGS. 1 to 3.

Referring to FIGS. 1 to 3, a semiconductor device 100 may include a substrate 101, active regions 105, device isolation layers 110, source/drain regions 150, gate structures 160, and a gate separation portion 170. The gate structure 160 may include a gate dielectric layer 162, a gate electrode 165, and gate spacer layers 166. The gate separation portion 170 may include a first gate separation layer 172 and a second gate separation layer 174.

The semiconductor device 100 may include FinFET devices in which the active regions 105 have a fin structure. The FinFET devices may include transistors about the active regions 105 and the gate structures 160 that intersect with each other.

The substrate 101 may have an upper surface extending in an X direction and a Y direction (e.g., a planar surface defined by the X direction and Y direction, X-Y plane). The substrate 101 may include a semiconductor material, e.g., a Group IV semiconductor, a Group III-V compound semiconductor, or a Group II-VI compound semiconductor. For example, the Group IV semiconductor may include silicon, germanium or silicon-germanium. The substrate 101 may be provided as a bulk wafer, an epitaxial layer, a silicon on insulator (SOI) layer, a semiconductor on insulator (SeOI) layer, or the like.

The device isolation layers 110 may define the active regions 105 in the substrate 101. In an implementation, the device isolation layers 110 may include a region extending deeper (e.g., in a Z direction perpendicular or orthogonal to the X-Y plane) into a lower portion of the substrate 101 between the active regions 105, and may be a single layer by being connected to each other in an end portion, in the X direction. In an implementation, the device isolation layers 110 may have a curved upper surface (e.g., inwardly curved or concave in the Z direction toward the substrate 101) having a higher height (e.g., having a portion that is farther from the substrate 101 in the Z direction) in a vicinity of or adjacent to the active regions 105. The device isolation layers 110 may be made of an insulating material. The device isolation layers 110 may be, e.g., an oxide, a nitride, or a combination thereof. As shown in the cross-sectional view of FIG. 2A, the device isolation layers 110 may have different heights at upper surfaces thereof (e.g., surfaces facing away from the substrate 101), in a lower portion and outside of the gate structure 160. In an implementation, the height differences of the upper surfaces may be variously altered.

The active regions 105 may be defined by the device isolation layers 110 in or on the substrate 101, and may extend in a first direction, e.g., the X direction. The active regions 105 may have a structure of an active fin protruding (e.g., in the Z direction) from the substrate 101. Upper ends of the active regions 105 may protrude to a predetermined height from (e.g., farther from the substrate 101 than) the upper surfaces of the device isolation layers 110 (e.g., in the Z direction). In an implementation, the active regions 105 may be formed of a portion of the substrate 101, or may include an epitaxial layer grown from the substrate 101. In an implementation, on both sides of the gate structures 160, the active regions 105 on the substrate 101 may be partially recessed, and the source/drain regions 150 may be on the recessed active regions 105. For example, as shown in FIGS. 2A and 2B, in or under the lower portion of the gate structure 160, the active regions 105 may have a relatively high height. In an implementation, the active regions 105 may include impurities, and at least a portion of the active regions 105 may include impurities of different conductivity types.

A dummy active region 105D may be further included between the active regions 105. The dummy active region 105D may be a region in which a channel region of a transistor is not formed in the semiconductor device 100, and an electrical function is not substantially performed. The dummy active region 105D may have a shape extending in the X direction similar to the active regions 105, and may be disposed at regular intervals together with the active regions 105. The dummy active region 105D may have a height H2 (e.g., in the Z direction) that is lower than a height H1 (in the Z direction) of the active region 105 in or adjacent to the lower portion of or under the gate separation portion 170, as shown in FIGS. 2A and 2B. This may be a shape formed by a process in which the active region 105 is partially removed and the dummy active region 105D is formed. This will be described in more detail below with reference to FIGS. 10A to 11G.

In an implementation, the dummy active region 105D may also have the height H2 that is lower than a height H3 (in the Z direction) of the recessed active region 105, on or at both sides of the gate structures 160. In this case, the dummy active region 105D may have a form recessed into the device isolation layer 110. In an implementation, the height of the dummy active region 105D on both sides of the gate structures 160 may be the same or similar height as the height H3 of the active region 105. In an implementation, the dummy active region 105D may have the same height in the lower portion of the gate separation portion 170 and on both sides of the gate structures 160. In an implementation, the dummy active region 105D may also have a height lower than the height in the lower portion of the gate separation portion 170, on both sides of the gate structures 160, similar to the active region 105.

Source/drain regions 150 may be on the active regions 105, respectively, at both sides of the gate structures 160. The source/drain regions 150 may be provided as a source region or a drain region of transistors. The source/drain regions 150 may have elevated source/drain shapes in which upper surfaces thereof are higher than lower (e.g., substrate-facing) surfaces of the gate structures 160, e.g., the gate electrodes 165.

In an implementation, the source/drain regions 150 may have a hexagonal shape. In an implementation, a portion of the source/drain regions 150 may have a hexagonal shape and the other portion thereof may have a pentagonal shape. In an implementation, the source/drain regions 150 may have various shapes, e.g., may have any one of shapes, for example, polygonal, circular, and rectangular. In an implementation, the source/drain regions 150 may be connected or merged to each other on two or more active regions 105 disposed adjacent to each other to form one source/drain region 150.

The source/drain regions 150 may be made of a semiconductor material. In an implementation, the source/drain regions 150 may be formed of an epitaxial layer. For example, the source/drain regions 150 may include n-type doped silicon (Si) and/or p-type doped silicon germanium (SiGe). In an implementation, the source/drain regions 150 may include a plurality of regions including elements having different concentrations and/or doping elements.

The gate structure 160 may extend in one direction, e.g., the Y direction, intersecting the active regions 105 in or on the upper portions of the active regions 105. A channel region of transistors may be formed in the active regions 105 intersecting the gate structure 160. The gate structure 160 may include a gate dielectric layer 162, a gate electrode 165, and gate spacer layers 166.

The gate dielectric layer 162 may be between the active regions 105 and the gate electrodes 165, and may cover the lower surfaces and both side surfaces of the gate electrodes 165. In an implementation, the gate dielectric layer 162 may be formed only on the lower surface of the gate electrode 165 (e.g., and may not extend along the sides of the gate electrode 165). The gate dielectric layer 162 may include an oxide, a nitride, or a high dielectric constant (high-k) material. The high-k material may refer a dielectric material having a dielectric constant, higher than that of silicon oxide ($SiO_2$). The high-k material may be any one of, e.g., aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may include a conductive material, and may include, e.g., a metal nitride such as a titanium nitride film (TiN), a tantalum nitride film (TaN), or a tungsten nitride film (WN), and/or a metal material such as aluminum (Al), tungsten (W), molybdenum (Mo), or the like, or a semiconductor material such as doped polysilicon. The gate electrodes 165 may be formed of two or more multilayer structures. The gate electrode 165 may be separated by the gate separation portion 170 between at least a portion of adjacent transistors, depending on the configuration of the semiconductor device 100.

The gate spacer layers 166 may be on both sides of the gate electrode 165. The gate spacer layers 166 may insulate the source/drain regions 150 and the gate electrodes 165 from each other. The gate spacer layers 166 may be formed of a multilayer structure according to example embodiments. The gate spacer layers 166 may include oxides, nitrides, and oxynitrides, e.g., low dielectric constant films.

The gate separation portion 170 may separate each gate electrode 165 extending in one direction (e.g., the Y direction) into a first gate electrode 165A and a second gate electrode 165B among at least a portion of transistors. The gate separation portion 170 may extend in a direction perpendicular to an extending direction of the gate electrode 165, e.g., in the X direction, to separate the gate dielectric layer 162 and the gate electrode 165. The gate separation portion 170 may include a first gate separation layer 172 and a second gate separation layer 174 vertically connected to each other. The first gate separation layer 172 may separate the gate electrode 165 from the upper portion of the gate structure 160, and the second gate separation layer 174 may be on the lower portion of the first gate separation layer 172, and may extend into the device isolation layer 110 between the active regions 105 (e.g., active regions 105 that are adjacent to each other in the Y direction).

In an implementation, the first gate separation layer 172 may be on a plane to separate the gate dielectric layers 162 on both sides as well as the gate electrode 165, as shown in FIG. 1. In an implementation, it is also possible that the first gate separation layer 172 separates only the gate electrode 165. The first gate separation layer 172 may extend downwardly (in the Z direction) from the upper surface of the gate electrode 165 and may extend to the upper surface of the active region 105 or to a similar height level thereto (e.g., a similar distance in the Z direction from the substrate 101). The lower surface of the first gate separation layer 172 may be at a height (e.g., a distance from the substrate 101 in the Z direction) that is higher than the upper surface of the device isolation layer 110. In an implementation, the upper surface of the first gate separation layer 172 may be coplanar with the gate electrode 165.

The second gate separation layer 174 may be on the dummy active region 105D, and the upper surface of the second gate separation layer 174 may be in contact (e.g., direct contact) with the first gate separation layer 172. The second gate separation layer 174 together with the dummy active region 105D may have the same or similar shape as the active region 105. For example, the second gate separation layer 174 may have a shape corresponding to (e.g., similar or identical to) an upper region of the active region 105, and the upper surface of the second gate separation layer 174 may be located at substantially the same height as the upper surfaces of the adjacent active regions 105. The second gate separation layer 174 may protrude upwardly and downwardly from or relative to the upper surface of the device isolation layer 110. For example, a lower portion of the second gate separation layer 174 may extend into the device isolation layer 110 to be in a recessed form or area of the device isolation layer 110, as shown in FIG. 2A.

In an implementation, a lower surface of the second gate separation layer 174 may be at a lower height level (e.g., closer to the substrate 101 in the Z direction) than that of the upper surface of the device isolation layer 110, and may have a downward convex shape (e.g., in the Z direction toward the substrate 101). In an implementation, the lower surface of the second gate separation layer 174 may have a flat surface, depending on a manufacturing method thereof. A recessed depth D1 and a protruded height H4 of the second gate separation layer 174 from the upper surface of the device isolation layer 110 may be variously altered in the example embodiments. A side surface of the second gate separation layer 174 at the upper portion thereof (e.g., distal to the substrate 101 in the Z direction) may be in contact (e.g., direct contact) with the gate dielectric layer 162. A side surface of the second gate separation layer 174 at the lower portion thereof (e.g., proximate to the substrate 101 in the Z direction) may be in contact (e.g., direct contact) with the device isolation layer 110.

In an implementation, the second gate separation layer 174 may have a width W2 (in the Y direction) that is smaller than the width W1 (in the Y direction) of the first gate separation layer 172. For example, a step or a bending portion according to the difference in width may be present between the first gate separation layer 172 and the second gate separation layer 174. The width W1 of the first gate separation layer 172 may be, e.g., 5 nm to 100 nm, and the width W2 of the second gate separation layer 174 may be, e.g., 1 nm to 20 nm. In an implementation, the width W2 of the second gate separation layer 174 may be the same as or similar to the width of the active region 105. In an implementation, as shown in the cross-section of III-III' of FIG. 2B, the second gate separation layer 174 may have a side surface that is perpendicular to the upper surface of the dummy active region 105D. In an implementation, the second gate separation layer 174 may have a shape corresponding to the shape of the gate structure 160. For example, it is also possible that the second gate separation layer 174 has a shape in which the width is widened toward the lower portion in the cross-section of III-III'. The second gate separation layer 174 may only be on the lower portion of the first gate separation layer 172 on a plane, as shown in FIG. 1, and may not extend to the lower portion of the gate spacer layer 166. In an implementation, the second gate separation layer 174 may also extend to the lower portion of the gate spacer layer 166.

The first and second gate separation layers 172 and 174 may include the same or different insulating materials. The first and second gate separation layers 172 and 174 may be made of a material capable of having etching selectivity under a specific etching condition with respect to the device isolation layer 110, and may be made of a material capable of having etching selectivity with respect to a second sacrificial layer 184, or the like, described with reference to FIG. 10E. In an implementation, the first and second gate separation layers 172 and 174 may each independently include, e.g., SiN, SiOCN, AlN, or the like.

The gate separation portion 170 may include first and second gate separation layers 172 and 174 vertically stacked and disposed such that the adjacent first and second gate electrodes 165A and 165B may be electrically and completely separated. For example, the second gate separation layer 174 may be formed using the dummy active region 105D to completely isolate the first and second gate electrodes 165A and 165B electrically in the X direction and block a leakage current. For example, even when the gate structures 160 have a shape widened in the X direction in a region adjacent to the device isolation layer 110, the second gate separation layer 174 may be fill a region between a pair of gate space layers 166 such that the first and second gate electrodes 165A and 165B may be completely electrically insulated from each other.

As shown in FIG. 1, a distance W3 from a side surface of the second gate separation layer 174 in the Y direction to a side surface of the adjacent active region 105 may be a factor affecting the characteristic such as a threshold voltage of a transistor formed by the active region 105 and the gate structure 160. With regard thereto, in an implementation, the gate separation portion 170 may include the second gate separation layer 174 at the lower portion thereof, as compared with the case in which the gate separation portion 170 includes only the first gate separation layer 172 (e.g., without the second gate separation layer 174), and a portion which affects the characteristics of the transistor may be formed without any process deviation, and the electrical characteristics of the semiconductor device 100 may be further improved.

Figure 4A:
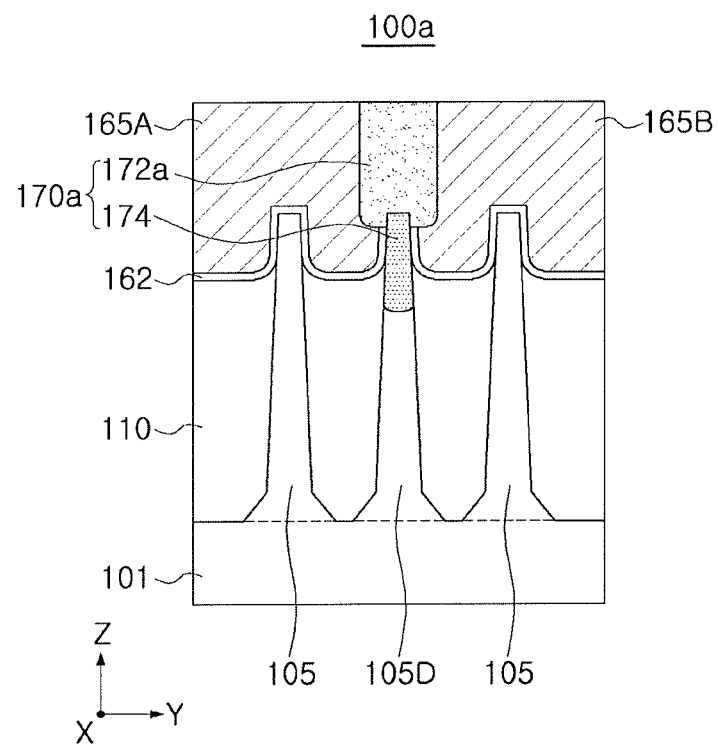
FIGS. 4A and 4B illustrate cross-sectional views of a semiconductor device according to example embodiments.
Figure 4B:
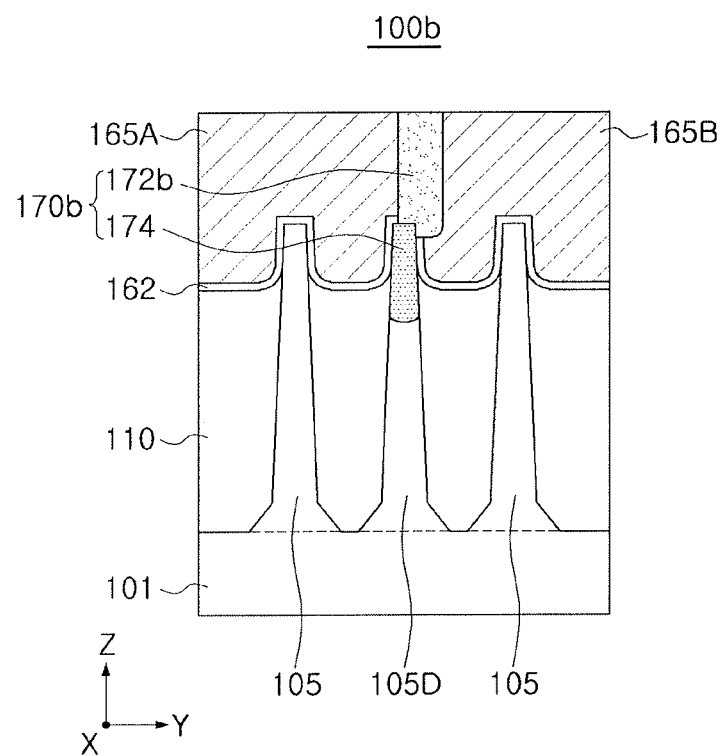

FIGS. 4A and 4B illustrate cross-sectional views of a semiconductor device according to example embodiments. FIGS. 4A and 4B illustrate regions corresponding to the cross-section along I-I' in FIG. 2A.

Referring to FIG. 4A, in a semiconductor device 100a, a first gate separation layer 172a of a gate separation portion 170a may cover a portion of the side surface of the second gate separation layer 174. For example, the first gate separation layer 172a may extend downwardly (e.g., in the Z direction toward the substrate 101) along the side surface of the second gate separation layer 174 to a predetermined depth from the upper portion of the second gate separation layer 174. In an implementation, the lower surface of the first gate separation layer 172a on the side surface of the second gate separation layer 174 may extend along the side surface of the second gate separation layer 174 to have a more curved shape.

A gate dielectric layer 162 may be between the second gate separation layer 174 and the gate electrode 165, and may not be on the upper surface and side surfaces of the second gate separation layer 174 that are in contact with the first gate separation layer 172a.

Referring to FIG. 4B, in a semiconductor device 100b, a first gate separation layer 172b of a gate separation portion 170b may cover a portion of the upper surface and a portion of (e.g., only) one side surface of the second gate separation portion 174. For example, the first gate separation layer 172b may extend downwardly along the one side surface of the of the second gate separation layer 174 to a predetermined depth from an upper portion of the second gate separation layer 174. In an implementation, the lower surface of the first gate separation layer 172b on the side surface of the second gate separation layer 174 may extend along the side surface of the second gate separation layer 174 to have a more curved shape.

The gate dielectric layer 162 may be between the second gate separation layer 174 and the gate electrode 165, and may not be on the upper surface and side surfaces of the second gate separation layer 174 that are in contact with the first gate separation layer 172b.

Figure 5A:
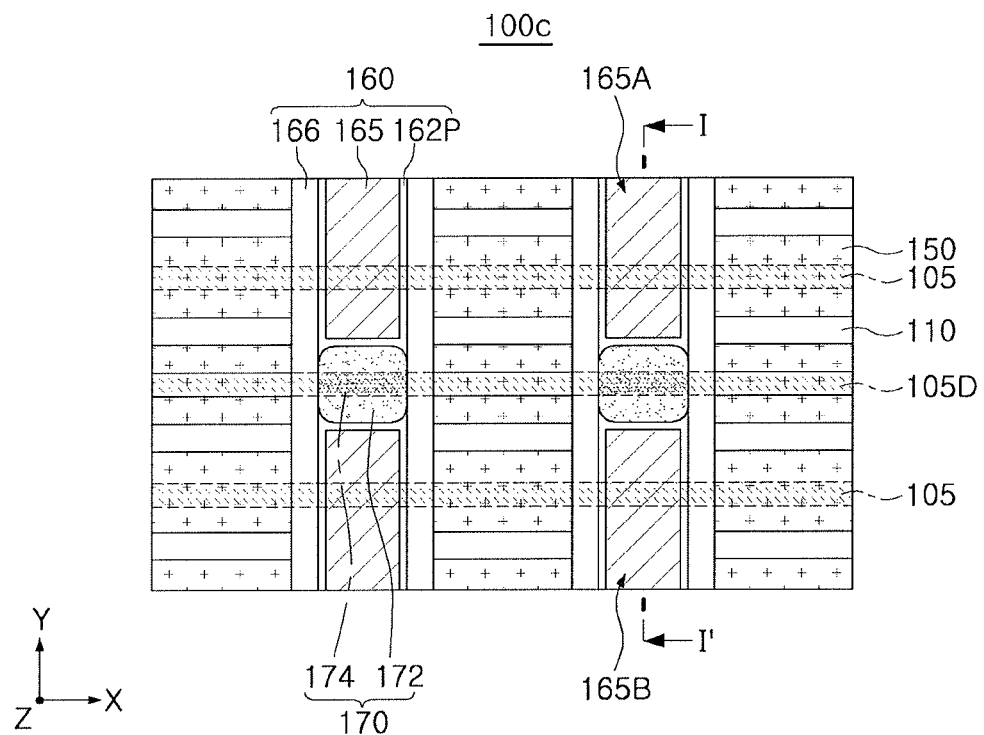
FIGS. 5A and 5B illustrate a plan view and a cross-sectional view of a semiconductor device according to example embodiments.
Figure 5B:
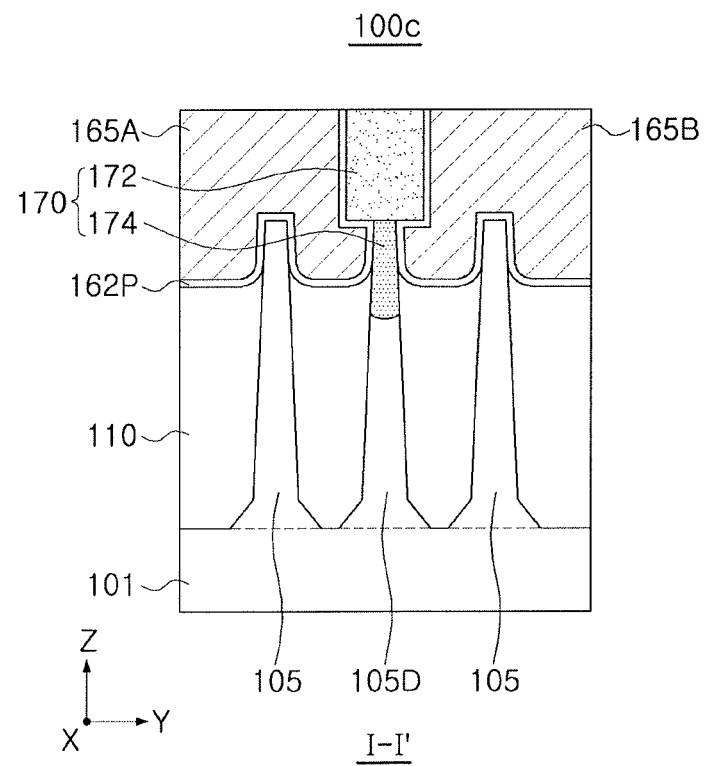

FIGS. 5A and 5B illustrate a plan view and a cross-sectional view of a semiconductor device according to example embodiments. FIG. 5B illustrates a cross-sectional view of the semiconductor device of FIG. 5A taken along the line I-I'.

Referring to FIGS. 5A and 5B, in a semiconductor device 100c, a gate dielectric layer 162P of the gate structure 160 may be further disposed on the side surface of the first gate separation layer 172 (e.g., side surfaces of the first gate separation layer 172 facing in the Y direction). As illustrated in FIG. 5B, the gate dielectric layer 162P may extend on the side surface of the first gate separation layer 172 as well as on the side surface of the second gate separation layer 174. This structure may be generated by a manufacturing method difference described below with reference to FIGS. 12A to 12C. In an implementation, as shown in FIG. 5A, the gate dielectric layer 162P may not be on the side surface of the first gate separation layer 172 facing in the X direction.

Figure 6A:
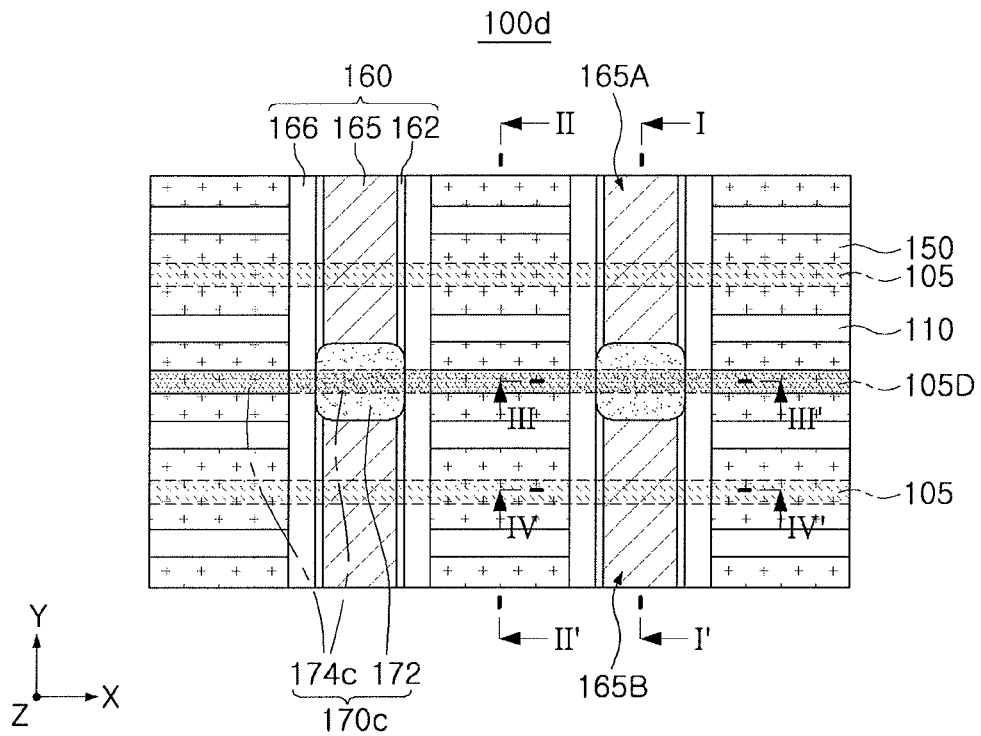
FIGS. 6A to 6C illustrate a plan view and cross-sectional views of a semiconductor device according to example embodiments.
Figure 6B:
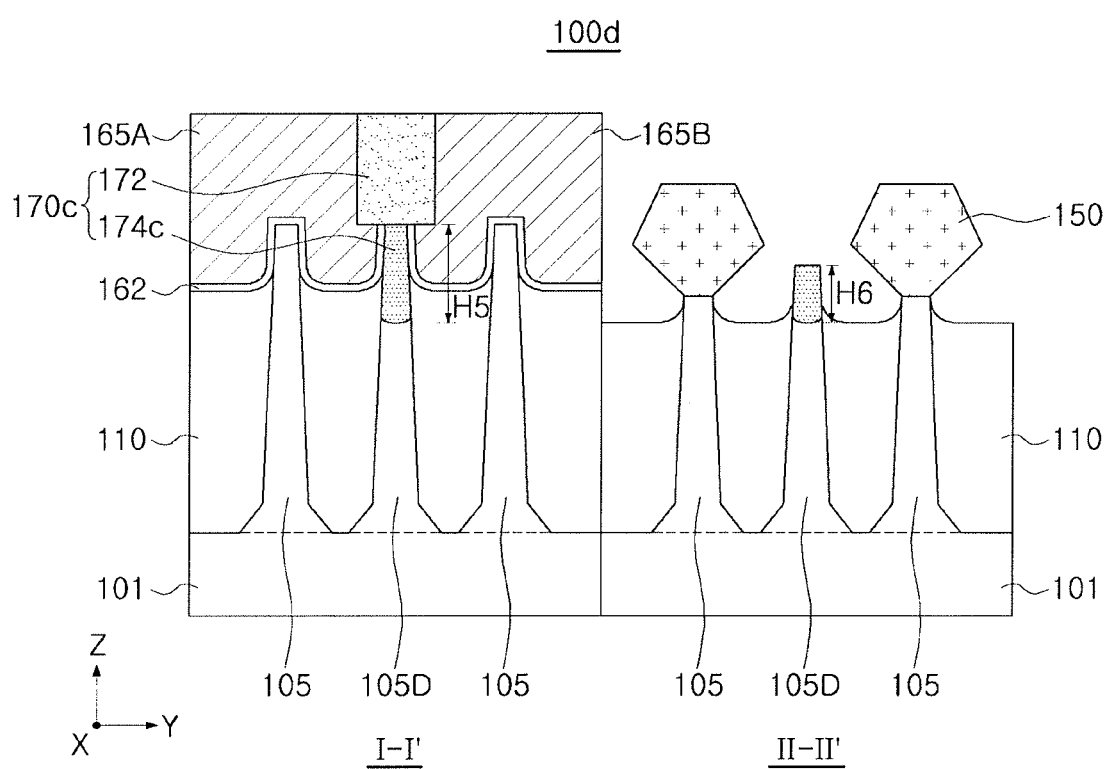
Figure 6C:
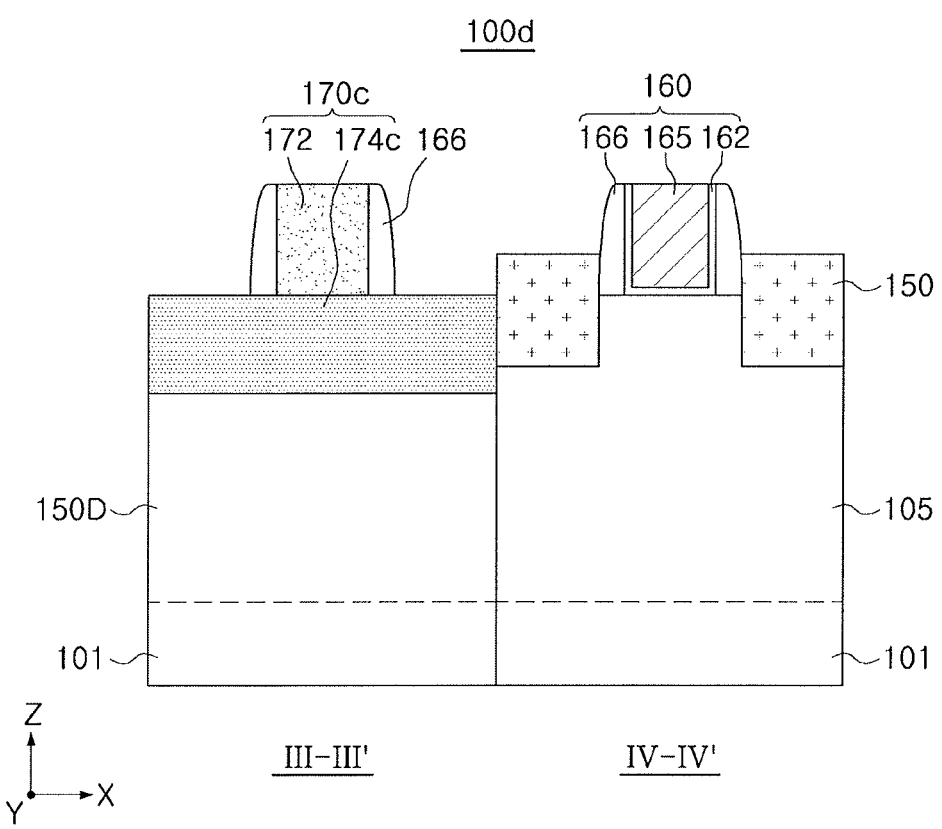

FIGS. 6A to 6C illustrate a plan view and cross-sectional views of a semiconductor device according to example embodiments. FIGS. 6B and 6C illustrate cross-sections of the semiconductor device of FIG. 6A cut along the cutting lines I-I' and II-II', and III-III' and IV-IV', respectively.

Referring to FIGS. 6A to 6C, in a semiconductor device 100d, a second gate separation layer 174c of a gate separation portion 170c may have an extended shape together with the dummy active region 105D in the X direction. For example, on or at both sides of the gate structure 160, a second gate separation layer 174c may be between adjacent source/drain regions 150, as illustrated in the cross-sectional view taken along II-II' of FIG. 6B. The second gate separation layer 174c may have a height H6 at a portion outside of the gate structure 160 that is lower than the height H5 of the second gate separation layer 174c in the lower portion of or underlying the first gate separation layer 172. For example, a growth of the source/drain regions 150 may be performed more easily. In an implementation, the height H5 of the second gate separation layer 174c underlying the first gate separation layer 172 may be the same as the height H6 outside of the gate structure 160.

Figure 7A:
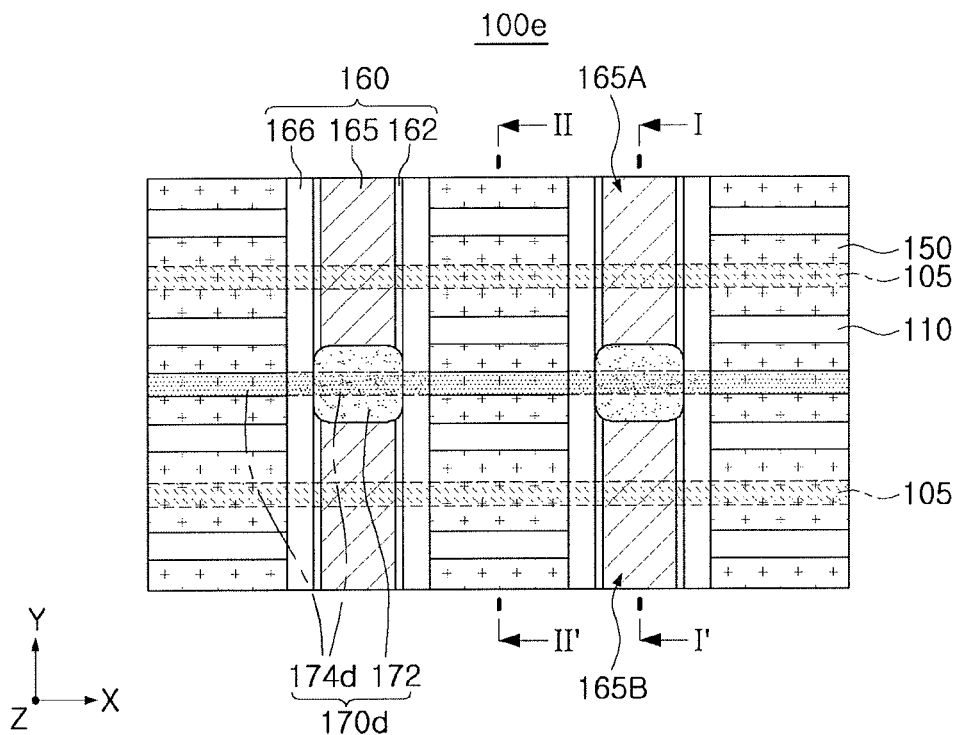
FIGS. 7A and 7B illustrate a plan view and a cross-sectional view of a semiconductor device according to example embodiments.
Figure 7B:
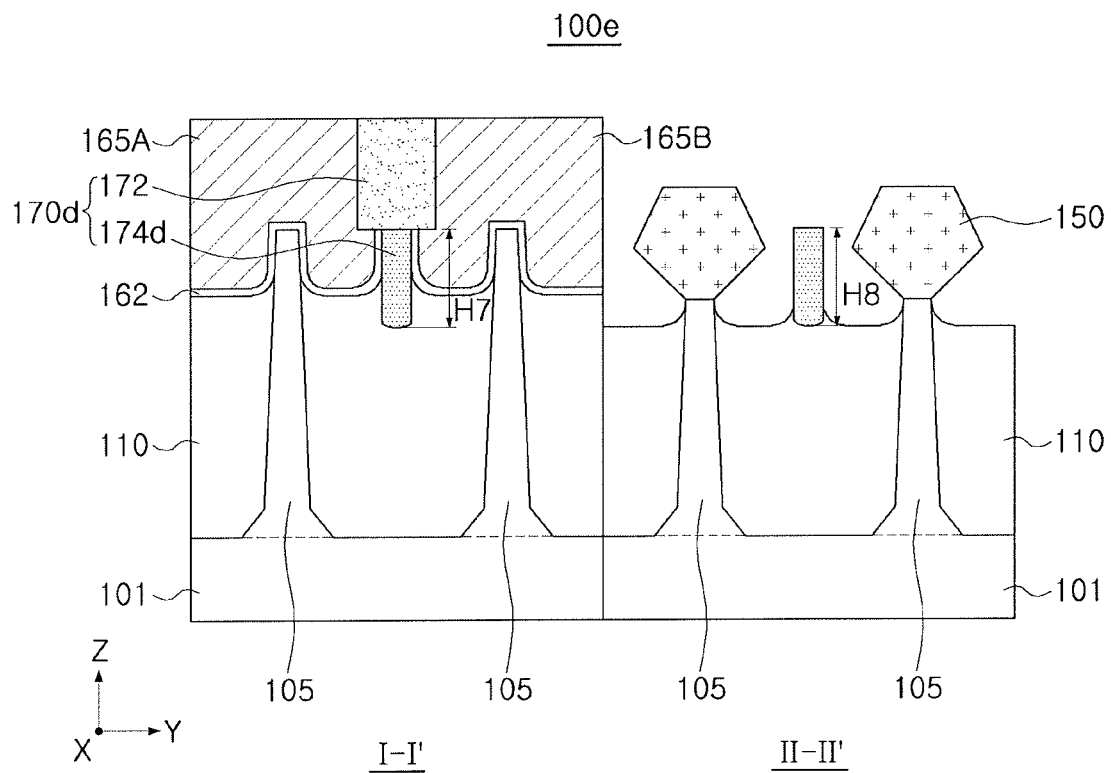

FIGS. 7A and 7B illustrate a plan view and a cross-sectional view of a semiconductor device according to example embodiments. FIG. 7B illustrates cross-sections taken along cutting lines I-I' and II-II' of the semiconductor device of FIG. 7A.

Referring to FIGS. 7A and 7B, in the semiconductor device 100e, the second gate separation layer 174d of the gate separation portion 170d may be on the device isolation layer 110. For example, the dummy active region 105D may not be present, e.g., may not be under the lower portion of the second gate separation layer 174d of the gate separation portion 170d. This structure may be formed by removing the active region 105 under the lower portion of the second gate separation layer 174*d* or by not forming the active region 105. The second gate separation layer 174*d* may extend into the device isolation layer 110 or between the device isolation layers 110 and the second gate separation layer 174*d* may be disposed such that a portion of the lower surface and the side surface are in contact with the device isolation layer 110 and have a protruded shape onto the device isolation layer 110 at the same time. In an implementation, the second gate separation layer 174*d* may have a shape that does not correspond to (e.g., may be independent to) the shape of the active region 105. For example, the width of the upper portion and the width of the lower portion of the second gate separation layer 174*d* may be substantially the same or the width of the lower portion may be narrower.

The second gate separation layer 174*d* may have a shape extending in the X direction together with the active region 105 to the outside of the gate structure 160. A height H7 of the second gate separation layer 174*c* under (e.g., between the first gate separation layer 172 and the substrate 101 in the Z direction or third direction) the lower portion of the first gate separation layer 172 may be the same as or different from a height H8 outside of the gate structure 160. If the height H8 outside of the gate structure 160 were to be smaller than the height H7 in the lower portion of the first gate separation layer 172, a growth of the source/drain regions 150 could be performed more easily. In an implementation, similar to the semiconductor device 100 of FIG. 1, the second gate separation layer 174*d* may not be disposed outside of the gate structure 160.

Figure 8:
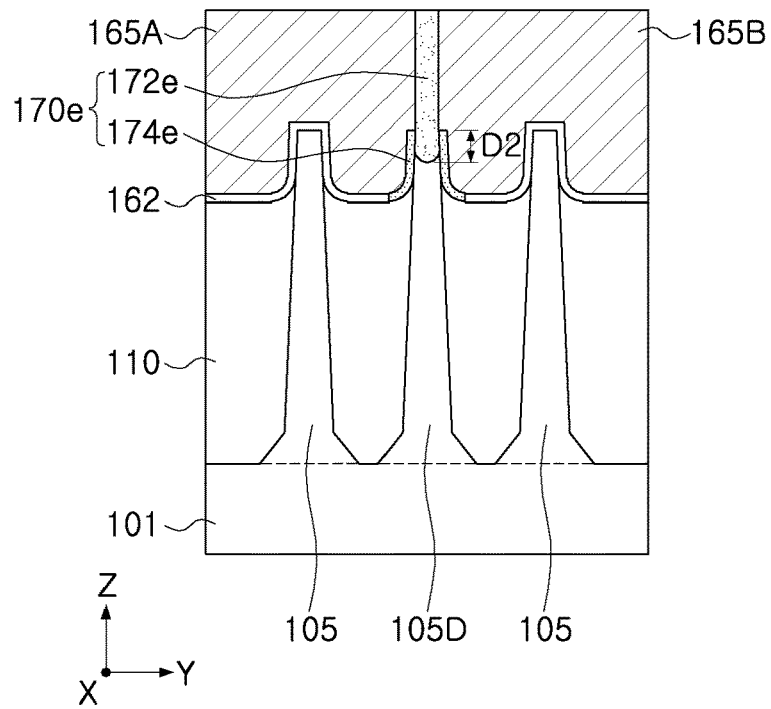
FIG. 8 illustrates a cross-sectional view of a semiconductor device according to example embodiments.

FIG. 8 illustrate a cross-sectional view of a semiconductor device according to example embodiments. FIG. 8 illustrates a region corresponding to a cross-section along the line I-I' of FIG. 2A.

Referring to FIG. 8, in a semiconductor device 100*f*, a gate separation portion 170*e* may have a shape in which the first gate separation layer 172*e* extends into the dummy active region 105D, and the second gate separation layer 174*e* may be on the side surface of the dummy active region 105D to have a shape contacting the first gate separation layer 172*e*.

The first gate separation layer 172*e* may have a recessed form of, e.g., may be in a recess in, the dummy active region 105D, and a recessed depth D2 may be selected in a range such that a lower end of the first gate separation layer 172*e* is located at a height level that is lower than that of the upper surface of the active region 105 and is located at a height level that is higher than that of the upper surface of the device isolation layer 110. For example, in the Z direction, a distance from the substrate 101 to the lower surface of the first gate separation layer 172*e* may be greater than a distance from the substrate 101 to the upper surface of the device isolation layer 110 and may be less than a distance from the substrate 101 to the upper surface of the active region 105. The second gate separation layer 174*e* may be formed of or from a portion of the gate dielectric layer 162, and may be made of the same material as the gate dielectric layer 162 or may further include impurities in the material of the gate dielectric layer 162. In an implementation, the second gate separation layer 174*e* may further include a layer formed by oxidizing or nitriding the dummy active region 105D. In an implementation, the dummy active region 105D may further include impurities in the upper portion thereof. The dummy active region 105D may have a substantially insulating property due to the presence of the impurities.

According to the gate separation portion 170*e* of the present embodiment, a process for forming the second gate separation layer 174*e* may be simplified, such that a manufacturing process may be relatively easily performed. For example, the second gate separation layer 174*e* may be easily formed even when sizes of structures of the semiconductor device 100*f* including the gate structure 160 are reduced.

Figure 9A:
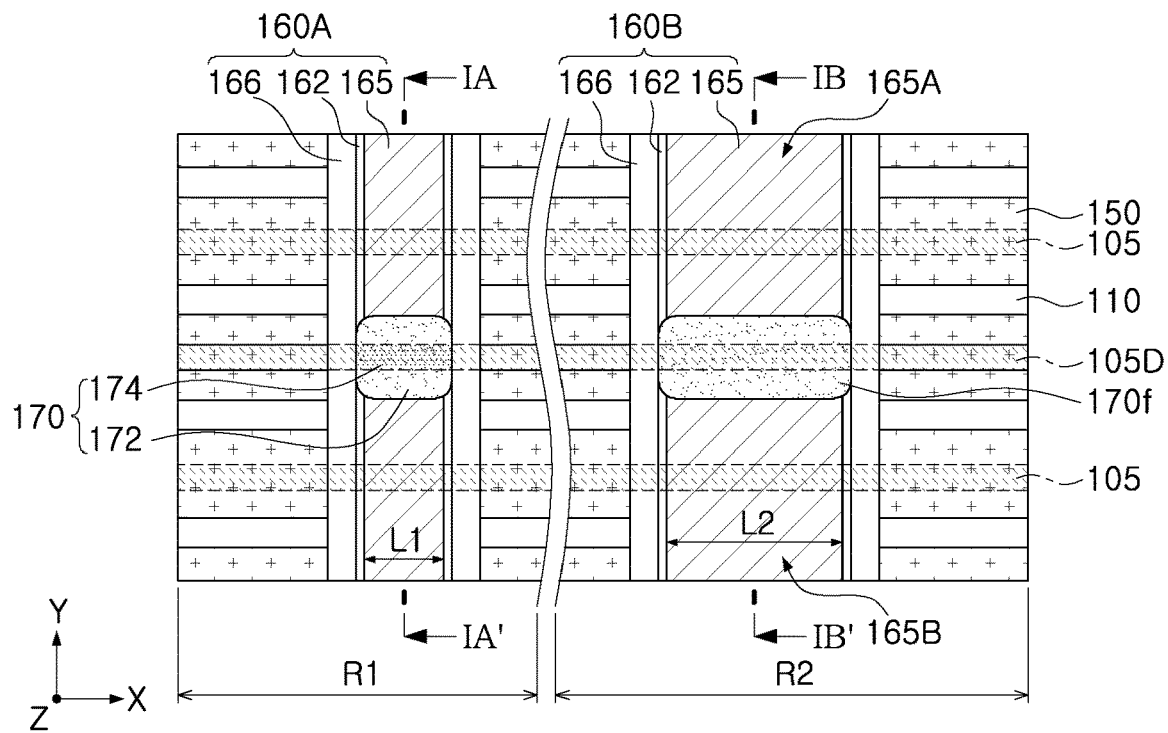
FIGS. 9A and 9B illustrate a plan view and a cross-sectional view of a semiconductor device according to example embodiments.
Figure 9B:
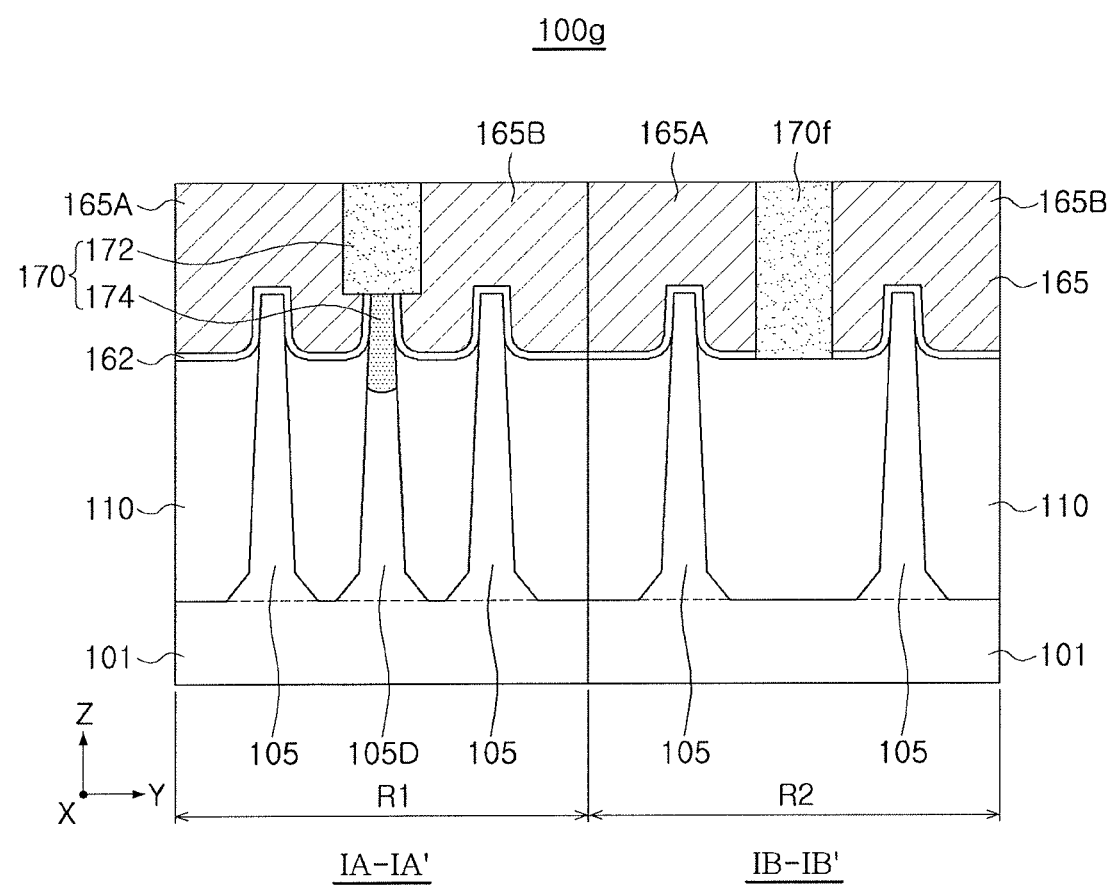

FIGS. 9A and 9B illustrate a plan view and a cross-sectional view of a semiconductor device according to example embodiments. FIG. 9B shows cross sections cut along the cutting lines IA-IA' and IB-IB' of the semiconductor device of FIG. 9A.

Referring to FIGS. 9A and 9B, a semiconductor device 100*g* may include first and second regions R1 and R2 in which gate structures 160A and 160B including gate electrodes 165 having first and second lengths L1 and L2 in the X direction. The second length L2 may be greater than the first length L1. In the first region R1, the gate separation portion 170 may include first and second gate separation layers 172 and 174, as in the semiconductor device 100 of FIG. 1. In the second region R2, the gate separation portion 170*f* may be formed of a single layer, unlike the first region R1, may isolate the first and second gate electrodes 165A and 165B, and may extend from the upper portion or surface thereof in the Z direction to at least the upper surface of the device isolation layer 110.

As described above, the gate structures 160A may be isolated by the gate separation portion 170 having a plurality of layers, being stacked vertically, in a portion of the semiconductor device 100*g*, and may be isolated by the gate separation portion 170*f* having a single layer, in the other region of the semiconductor device 100*g*. In an implementation, the first and second regions R1 and R2 may be divided according to the lengths of the gate structures 160A and 160B. In an implementation, the first and second regions R1 and R2 may be divided according to a spacing distance between the first and second gate electrodes 165A and 165B, and the gate separation portion 170*f* having the single layer may be used when the spacing distance is large. Further, the first and second regions R1 and R2 may be selected in consideration of the size and the degree of integration of elements in the semiconductor device 100*g*. For example, the structure and the process suitable for each region may be selectively applied to the semiconductor device 100*g*, such that the manufacturing process may be efficiently performed while ensuring reliability.

FIGS. 10A to 10L illustrate views of stages in a manufacturing method of a semiconductor device according to example embodiments according to a process order. In FIGS. 10A to 10L, an example embodiment of the manufacturing method for manufacturing the semiconductor device of FIGS. 1 to 3 will be described.

Figure 10A:
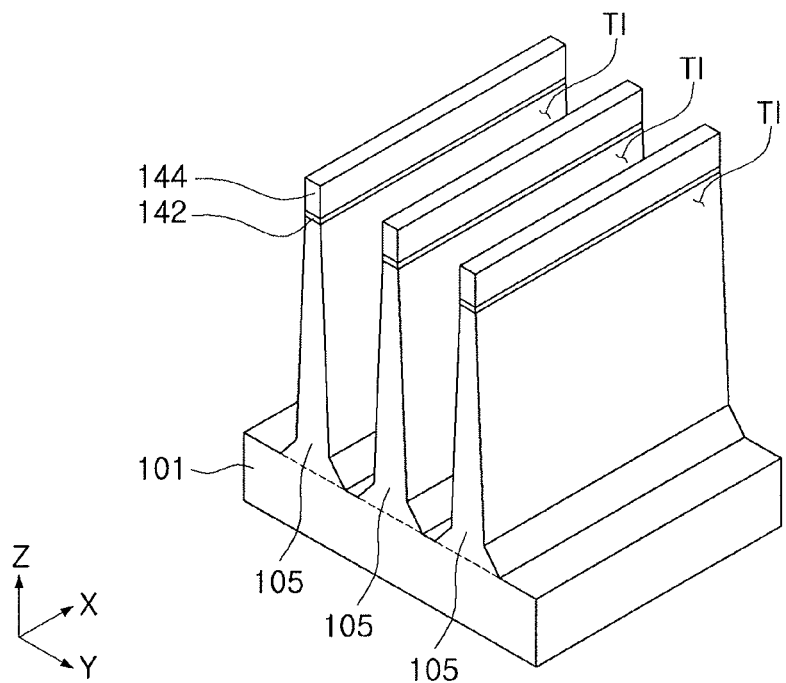
FIGS. 10A to 10L illustrate views of stages in a manufacturing method of a semiconductor device according to a process order according to example embodiments.

Referring to FIG. 10A, a substrate 101 may be patterned to form trench regions TI defining active regions 105.

First, a pad oxide pattern 142 and a first mask pattern 144 may be formed on the substrate 101. In an implementation, the pad oxide pattern 142 may be a layer for protecting upper surfaces of the active regions 105. In an implementation, the pad oxide pattern 142 may be omitted. The first mask pattern 144 may be a mask layer for patterning the substrate 101, and may include silicon nitride, a carbon-containing material, or the like. The first mask pattern 144 may be formed of a multilayer structure.

The substrate 101 may be anisotropically etched using the pad oxide pattern 142 and the first mask pattern 144 to form the trench regions TI. The trench regions TI may have a high aspect ratio, widths thereof may become narrower toward the lower portion, and accordingly, the active regions 105 may have a shape becoming narrower toward the upper portion.

Figure 10B:
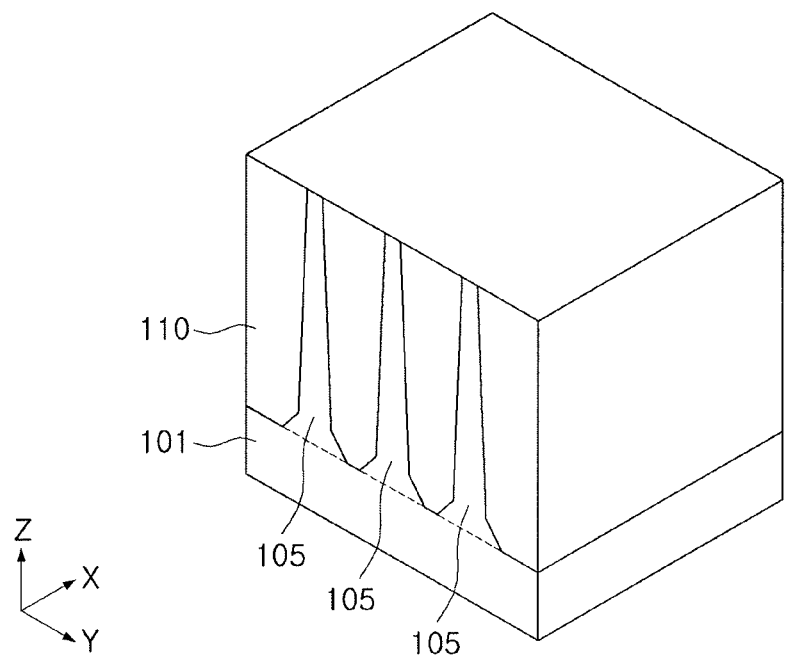

Referring to FIG. 10B, the device isolation layer 110 filling the trench regions TI may be formed.

A process of planarizing the trench regions TI along the upper surfaces of the active regions 105 after the trench regions TI are filled with an insulating material may be performed. During the planarization process, at least a portion of the pad oxide pattern 142 and the first mask pattern 144 may be removed. In an implementation, the pad oxide pattern 142 may remain on the upper surfaces of the active areas 105 up to the process step described with reference to FIG. 10D. In an implementation, a relatively thin liner layer may first be formed in the trench regions TI and then the trench regions TI may be filled.

Figure 10C:
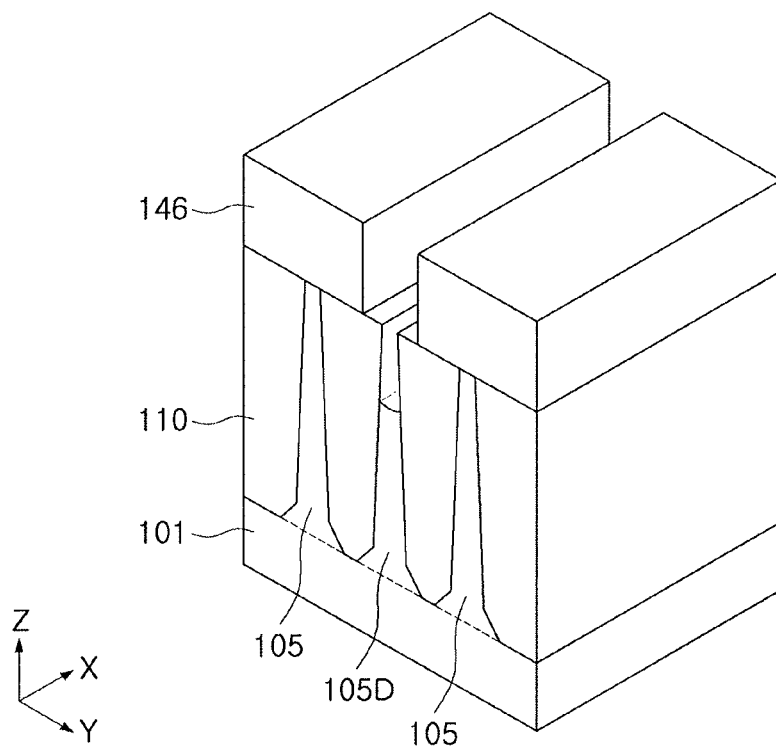

Referring to FIG. 10C, a portion of the active region 105 may be removed to form a dummy active region 105D between the active regions 105.

First, a second mask pattern 146, exposing the active region 105 to be the dummy active region 105D may be formed on the device isolation layer 110. The second mask pattern 146 may be a mask layer for removing a portion of the exposed active region 105, and may include a material having etch selectivity with respect to the material of the device isolation layer 110 and the active regions 105. The second mask pattern 146 may be formed as a multilayer structure.

Next, the dummy active region 105D may be formed by removing the exposed active region 105 to a predetermined depth from the upper surface. The active region 105 to be recessed may be selectively removed by wet etching, or the like, with respect to the device isolation layer 110, and the recess depth may be controlled by adjusting an etching time, and the like, and may be variously changed in example embodiments.

The semiconductor device 100e with reference to FIGS. 7A and 7B may be formed by removing or not forming a portion of the active regions 105, removing the device isolation layer 110 from the upper portion to a predetermined depth to form the second gate separation layer 174d, and then performing subsequent steps.

Figure 10D:
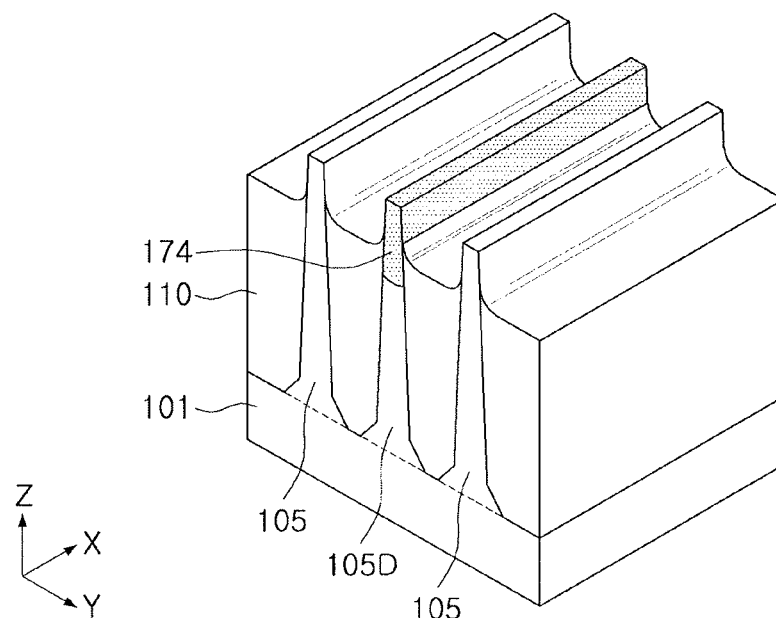

Referring to FIG. 10D, the second gate separation layer 174 may be formed on the dummy active region 105D, and the active regions 105 and the second gate separation layer 174 may be formed to protrude onto the device isolation layer 110.

First, a material for forming the second gate separation layer 174 may be filled in the dummy active region 105D (that has been recessed into the device isolation layer 110) as shown in FIG. 10C to form the second gate separation layer 174. After the second gate separation layer 174 is formed, the second mask pattern 146 may be removed, and a planarization process may be further performed, if desired.

Next, the device isolation layer 110 may be partially removed from the upper portion to perform a process of protruding the active regions 105 and the second gate separation layer 174 onto or from the device isolation layer 110. The process may be performed, e.g., by wet etching process, and the present process may be performed in a state the pad oxide pattern 142 of FIG. 10A or a separate mask layer is formed on the active regions 105 for protecting the active regions 105. For example, the active regions 105 and the second gate separation layer 174 may protrude to a predetermined height from the upper portion of the device isolation layer 110, and the protruded height may be variously changed in example embodiments. During the etching process, the pad oxide pattern 142 or the separate mask layer may also be removed together.

Figure 10E:
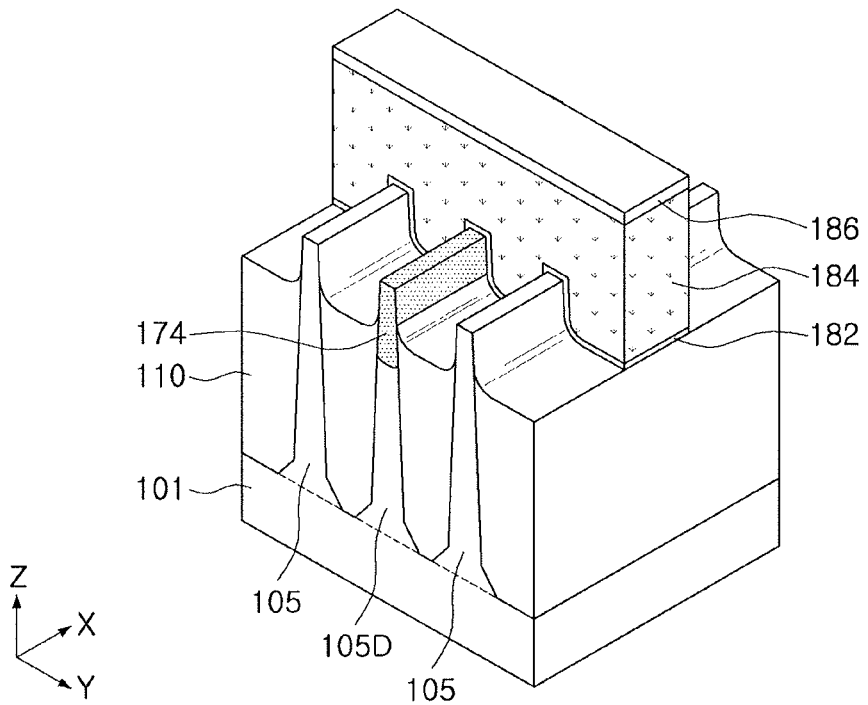

Referring to FIG. 10E, first and second sacrificial layers 182 and 184 may be formed on the active regions 105, the second gate separation layer 174, and the device isolation layer 110.

The first and second sacrificial layers 182 and 184 may be patterned to have a line shape extending in the Y direction intersecting the active regions 105. The first and second sacrificial layers 182 and 184 may be patterned using a third mask pattern layer 186. The first and second sacrificial layers 182 and 184 may be a sacrificial gate structure formed in a region in which the gate dielectric layer 162 and the gate electrode 165 are disposed as shown in FIG. 3 through a subsequent process.

In an implementation, the first and second sacrificial layers 182 and 184 may be an insulating layer and a conductive layer, respectively. In an implementation, the first and second sacrificial layers 182 and 184 may be formed of a single layer. For example, the first sacrificial layer 182 may include silicon oxide and the second sacrificial layer 184 may include polysilicon. The third mask pattern layer 186 may include silicon oxide and/or silicon nitride.

Figure 10F:
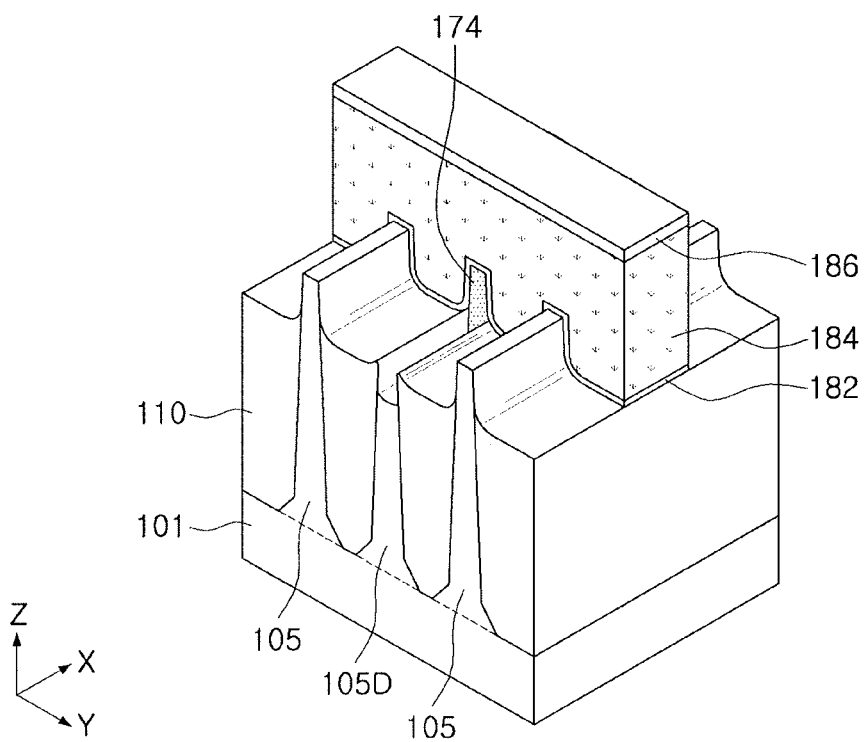

Referring to FIG. 10F, at least a portion of the second gate separation layer 174 may be removed from both sides or outside of the first and second sacrificial layers 182 and 184.

The second gate separation layer 174 may be selectively removed with respect to the active regions 105, the dummy active region 105D, and the device isolation layer 110, whereby the upper surface of the dummy active region 105D may be exposed. The second gate separation layer 174 may only remain on the lower portions of or under the first and second sacrificial layers 182 and 184. In an implementation, the second isolation layer 174 may be partially removed, but not all, from the upper surface thereof, to a predetermined depth. As described above, when the second gate separation layer 174 is removed on both sides of the first and second sacrificial layers 182 and 184, the growth of the source/drain regions 150 may not be disturbed by the second gate separation layer 174 when the source/drains 150 are formed in the subsequent processes.

The semiconductor device 100d described with reference to FIGS. 6A and 6B may be prepared by removing only a portion of the second gate separation layer 174 in the present step or omitting the present step.

Figure 10G:
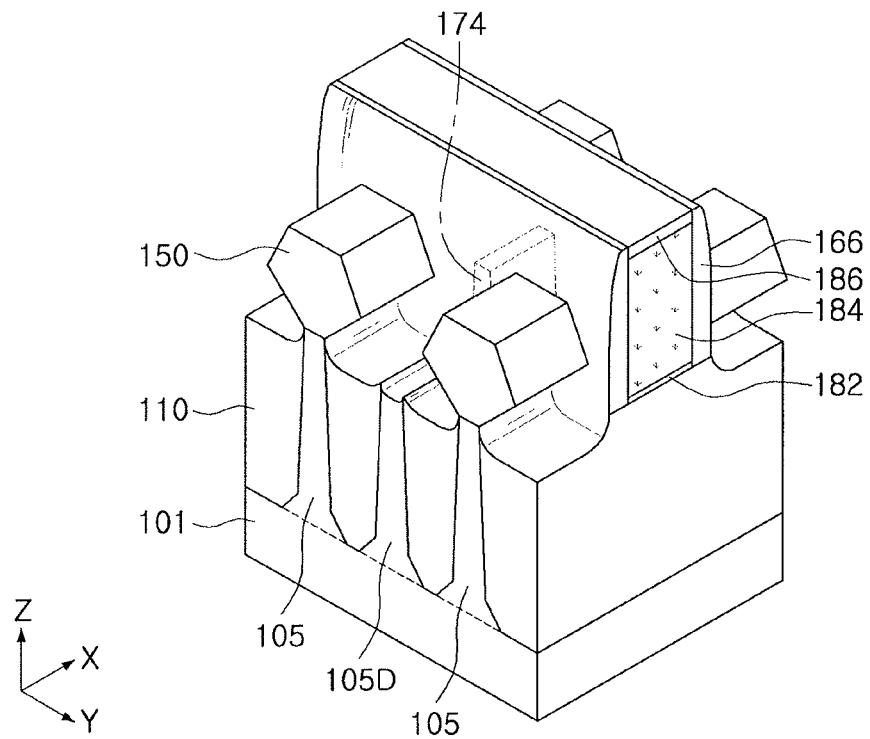

Referring to FIG. 10G, a gate spacer layer 166 may be formed on the active regions 105, the device isolation layer 110, and the third mask pattern layer 186 and the exposed active regions 105 may be recessed and the source/drain regions 105 may be formed.

First, the gate spacer layer 166 may be formed along the upper surfaces and/or the side surfaces of the active regions 105, the device isolation layer 110, the first and second sacrificial layers 182 and 184, and the third mask pattern layer 186 to have a uniform thickness. The gate spacer layer 166 may be made of a material having a low dielectric constant, and may include, e.g., at least one of SiO, SiN, SiCN, SiOC, SiON, and SiOCN.

Next, the gate spacer layer 166 may be removed from the upper surfaces of the active regions 105 to expose the upper surfaces of the active regions 105, and then the exposed active regions 105 may be recessed to a predetermined depth from the upper surface. The recess process may be performed, e.g., by sequentially applying a dry etching process and a wet etching process. For example, in the present step, the active regions 105 may have a lower height outside of the first and second sacrificial layers 182 and 184 than in the lower portions of the first and second sacrificial layer 182 and 184. Selectively, after the recess process, a process of curing surfaces of the recessed active regions 105 may be performed through a separate process. Selectively, a process of injecting impurities into the active regions 105, before or after the recess process may be performed. During these processes, the gate spacer layer 166 may have a shape as illustrated, being partially removed and remaining only on the side surfaces of the first to second sacrificial layers 182 and 184 and the third mask pattern layer 186. In an implementation, a material for forming the gate spacer layer 166 may remain in the form of a spacer on sidewalls of the active regions 105 as well. In an implementation, during the processes, the device isolation layer 110 may be partially removed outside of the first to second sacrificial layers 182 and 184 and the height thereof may be relatively reduced.

The source/drain regions 150 may be formed using, e.g., a selective epitaxial growth (SEG) process. The source/drain regions 150 may be, e.g., a silicon (Si) layer or a silicon germanium (SiGe) layer. During growth of the source/drain regions 150, impurities such as phosphorus (P), boron (B), and the like, may be doped in-situ or separately implanted after the growth. In an implementation, the source/drain regions 150 may be grown along a crystallographically stable surface in the growth process to have hexagonal, pentagonal, or similar shapes as shown according to the material for forming the source/drain regions 150.

Figure 10H:
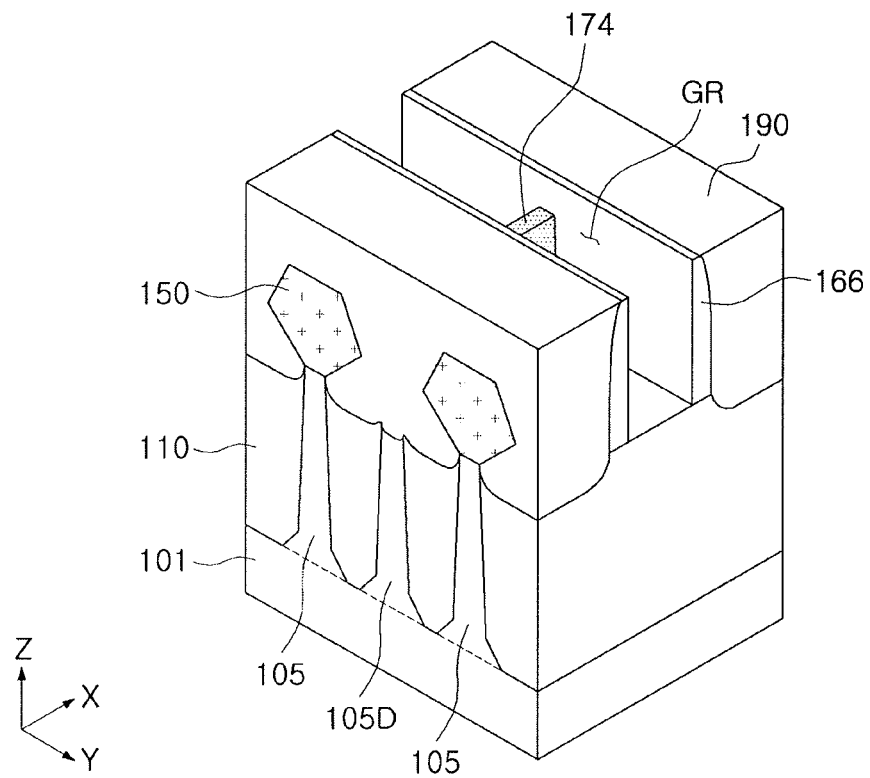

Referring to FIG. 10H, an interlayer insulating layer 190 may be formed on the source/drain regions 150, and the first and second sacrificial layers 182 and 184, the sacrificial gate structures, may be removed.

First, the interlayer insulating layer 190 may be formed by depositing an insulating material to cover the source/drain regions 150, the third mask pattern layer 186, and the gate spacer layer 166, and then by exposing the upper surface of the second sacrificial layer 182 through the planarization process. In the planarization process, the third mask pattern layer 186 may be removed. The interlayer insulating layer 190 may include at least one of, e.g., an oxide, a nitride, and an oxynitride, and may include a material having a low dielectric constant.

The first and second sacrificial layers 182 and 184 may be selectively removed with respect to the active regions 105, the device isolation layer 110, and the second gate separation layer 174, in the lower portion, and a gate region GR exposing the active regions 105, the device isolation layer 110, and the second gate separation layer 174 may be formed. The process of removing the first and second sacrificial layers 182 and 184 may be performed using at least one of a dry etching process and a wet etching process.

Figure 10I:
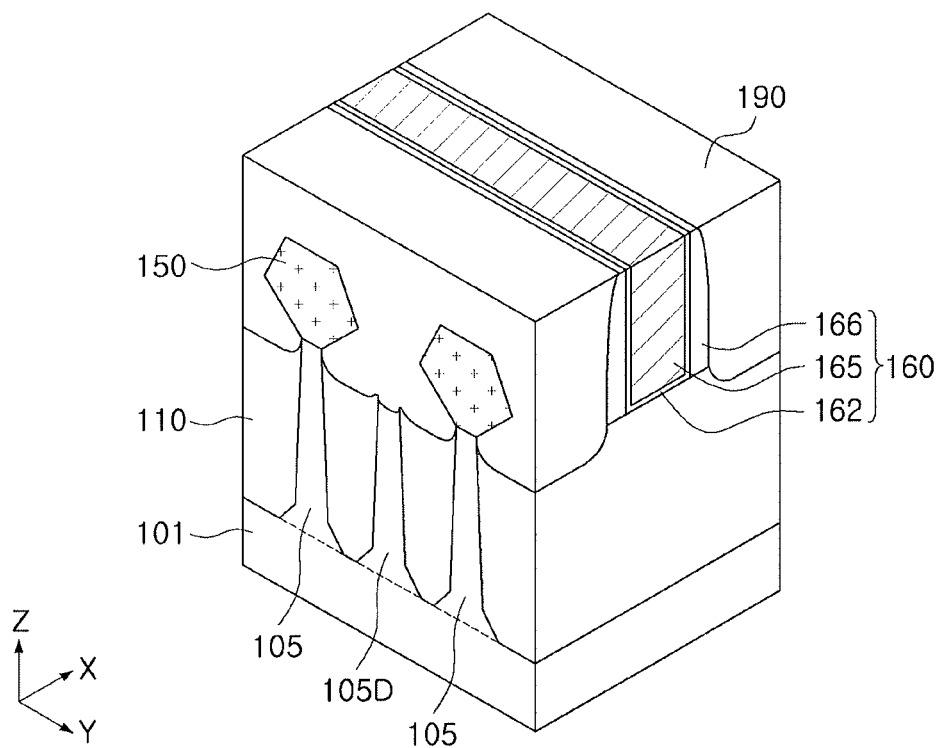

Referring to FIG. 10I, a gate dielectric layer 162 and a gate electrode 165 may be formed in the gate region GR to finally form the gate structure 160.

The gate dielectric layer 162 may be formed substantially conformally along the side wall and the lower surface of the gate region GR. The gate dielectric layer 162 may include an oxide, a nitride, and a high-k material. The gate electrode 165 may fill a space inside the gate dielectric layer 162. The gate electrode 165 may include a metal or a semiconductor material.

After the gate dielectric layer 162 and the gate electrode 165 are formed, a material remaining on the interlayer insulating layer 190 may be removed using a planarization process such as a chemical mechanical polishing (CMP) process.

Figure 10J:
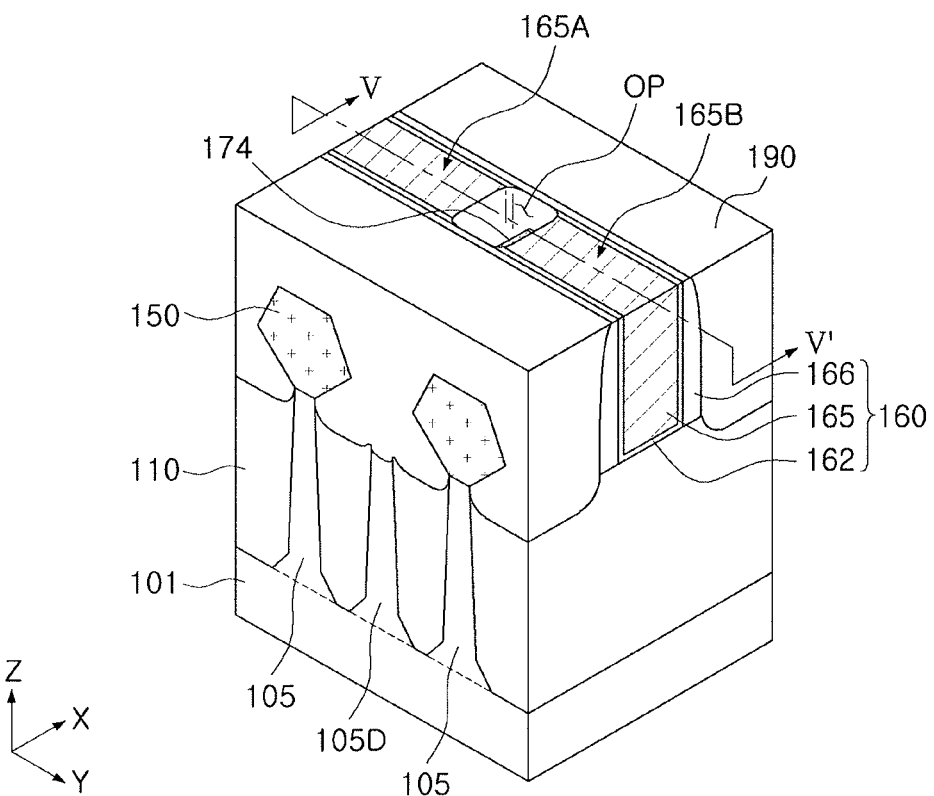
Figure 10K:
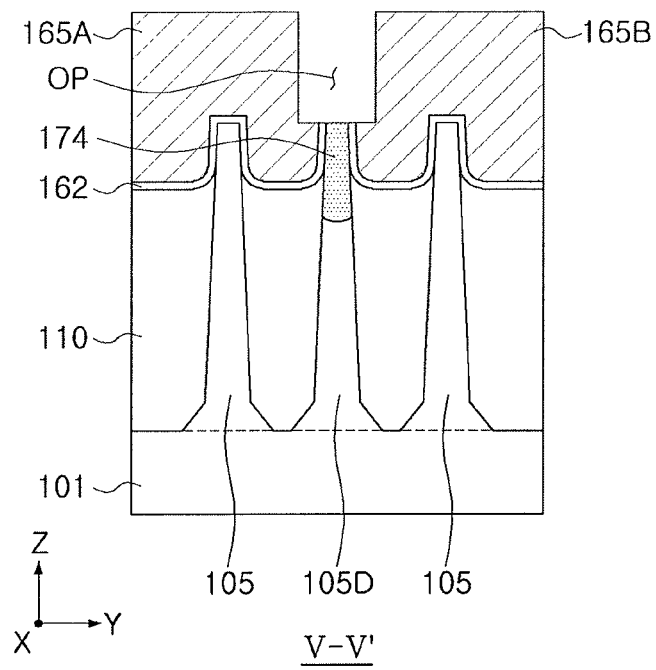

Referring to FIGS. 10J and 10K, a portion of the gate dielectric layer 162 and the gate electrode 165 may be removed to form an opening OP. FIG. 10K illustrates a cross-section taken along cutting line V-V' in FIG. 10J.

The opening OP may divide at least the gate electrode 165 of the gate structure 160 in the Y direction into the first and second gate electrodes 165A and 165B. The opening OP may be formed by not only removing a portion of the gate electrode 165 but also removing a portion of the gate dielectric layer 162. In an implementation, the opening OP may also be formed by removing the gate spacer layer 166 adjacent thereto in the Y direction.

Through the lower portion of the opening OP, the upper surface of the second gate separation layer 174 may be exposed, as shown in FIG. 10K. In the present step, the opening OP may not penetrate the entire thickness of the gate electrode 165, and may be formed by removing the gate electrode 165 only to the upper surface of the second gate separation layer 174, and the process may be performed relatively easily. In addition, the lower portion of the gate electrode 165 may be isolated by the second gate separation layer 174, a size of the opening OP, e.g., a margin of a width in the Y direction may be alleviated, and the process may be performed more easily.

Figure 10L:
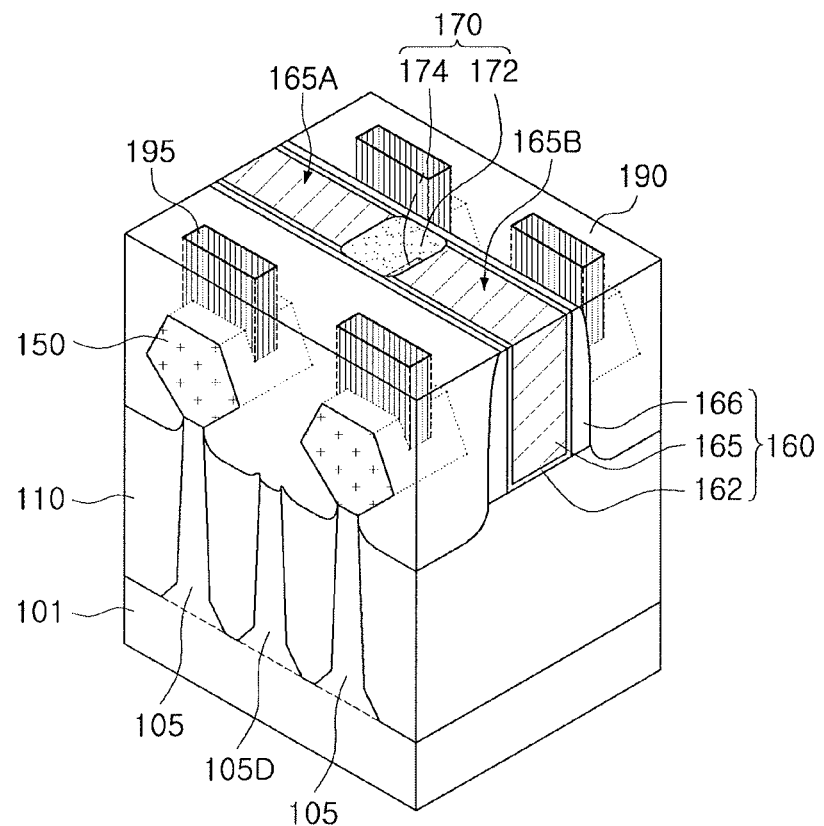

Referring to FIG. 10L, the first gate separation layer 170 may be formed by filling an insulating material in the opening OP to form the first gate separation layer 172, and contact plugs 195 may be formed. The first gate separation layer 172 may be formed by filling the opening OP with an insulating material, e.g., silicon nitride or the like.

Next, the interlayer insulating layer 190 may be patterned to form contact holes, and a conductive material may be embedded in the contact holes to form contact plugs 195. The contact holes may be formed by removing the interlayer insulating layer 190 on both sides of the gate structure 160 by using a separate mask layer such as a photoresist pattern. Lower surfaces of the contact holes may have a curvature along the upper surfaces of the source/drain regions 150. When removing the interlayer insulating layer 190, upper portions of the source/drain regions 150 may be partially recessed. The contact plugs 195 may be formed by depositing a conductive material in the contact holes to electrically connect the source/drain regions 150. In an implementation, the shape and disposition of the contact plugs 195 may be variously changed.

FIGS. 11A to 11G illustrate views of stages in a manufacturing method of a semiconductor device according to a process sequence according to example embodiments. In FIGS. 11A to 11G, another example embodiment of the manufacturing method for manufacturing the semiconductor device of FIGS. 1 to 3 will be described. Hereinafter, repeated descriptions overlapping with those described above with reference to FIGS. 10A to 10L may be omitted.

Figure 11A:
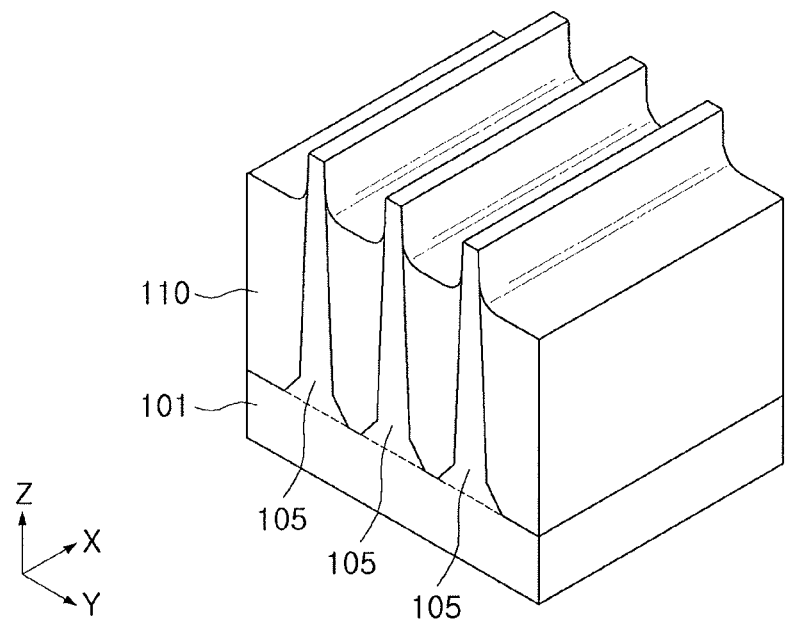
FIGS. 11A to 11G illustrate views of stages in a manufacturing method of a semiconductor device according to a process order according to example embodiments.

Referring to FIG. 11A, the active regions 105 and the device isolation layer 110 may be formed by patterning the substrate 101, and the active regions 105 may protrude from the device isolation layer 110.

First, as described with reference to FIGS. 10A and 10B, the substrate 101 may be patterned to form trench regions TI defining the active regions 105, and the device isolation layer 110 embedding the trench regions T1 may be formed.

Next, a process of protruding the active regions 105 from the device isolation layer 110 may be performed by partially removing the device isolation layer 110. However, unlike the example embodiment described above, with reference to FIGS. 10A to 10L, in the present step, the first gate separation layer 174 may not be formed.

Figure 11B:
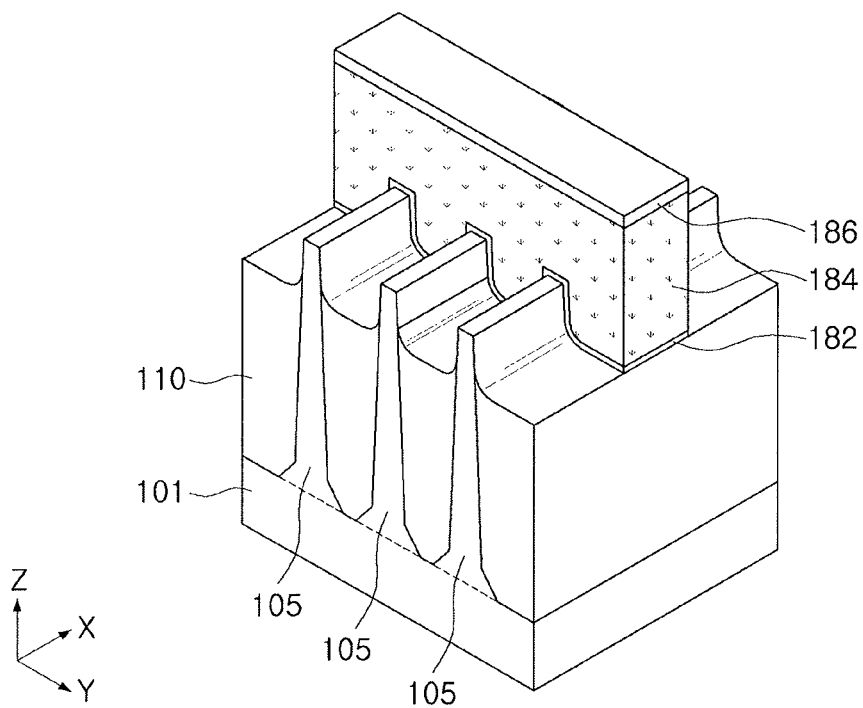

Referring to FIG. 11B, the first and second sacrificial layers 182 and 184 may be formed on the active regions 105 and the device isolation layer 110.

As described above with reference to FIG. 10E, the first and second sacrificial layers 182 and 184 may be patterned and formed so as to have a line shape extending in the Y direction intersecting the active regions 105. The first and second sacrificial layers 182 and 184 may be patterned using a third mask pattern layer 186.

Figure 11C:
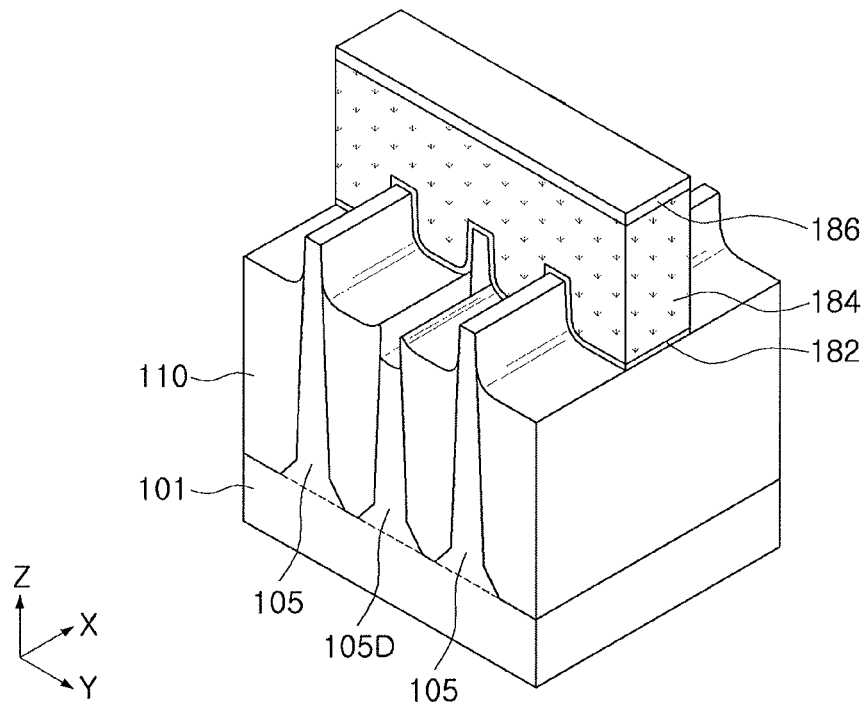

Referring to FIG. 11C, a dummy active region 105D may be formed by removing the exposed upper region of a portion of the active regions 105 from both sides or outside of the first and second sacrificial layers 182 and 184.

In order to form the dummy active region 105D, at least one upper region of the exposed active regions 105 may be selectively removed with respect to the device isolation layer 110. The depth of the active region 105 removed by the above process may be variously changed in example embodiments. For example, the dummy active region 105D may have a lower height than the active regions 105 on both sides of the first and second sacrificial layers 182 and 184. The dummy active region 105D may not be removed in the lower portions of, e.g., from under, the first and second sacrificial layers 182 and 184, and the dummy active region 105D may have substantially the same height as the active regions 105 under the first and second sacrificial layers 182 and 184.

Figure 11D:
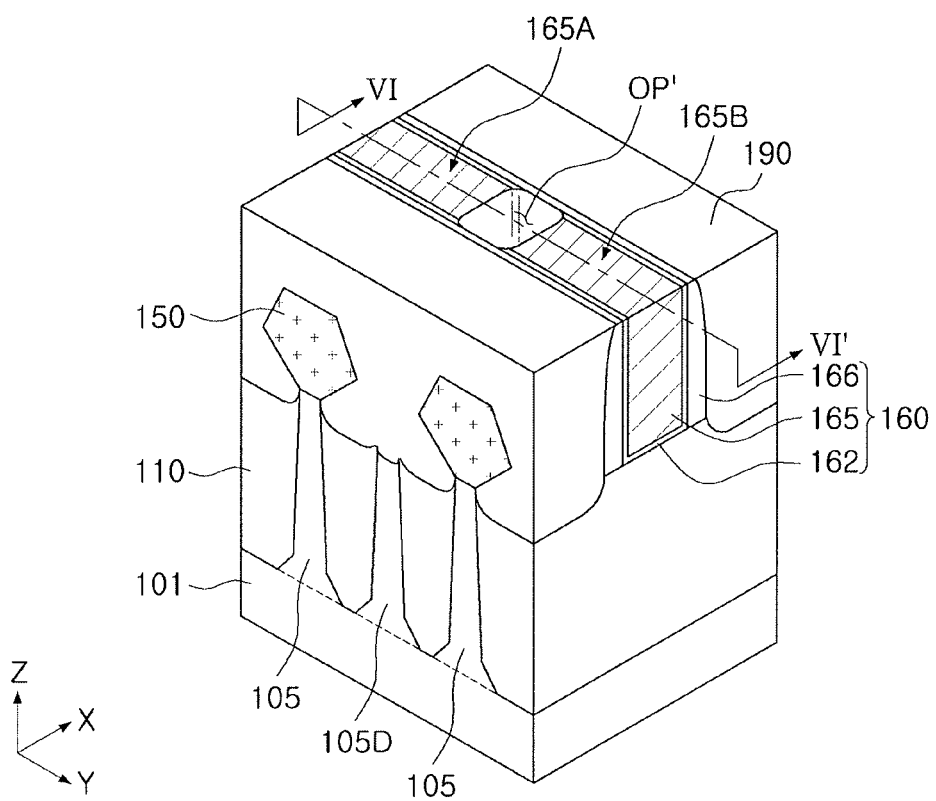
Figure 11E:
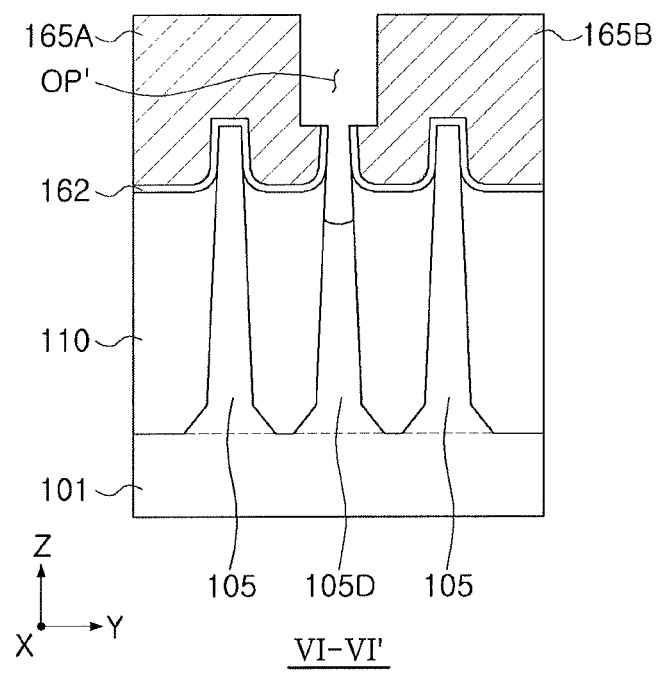

Referring to FIGS. 11D and 11E, a gate spacer layer 166, source/drain regions 150, an interlayer insulating layer 190, and a gate structure 160 may be formed, and an opening OP' may be formed. FIG. 11E illustrates a cross-section along the cutting line VI-VI' of FIG. 11D.

First, similar to those described above with reference to FIGS. 10G to 10I, the gate spacer layer 166, the source/drain regions 150, and the interlayer insulating layer 190 may be formed, and the first and second sacrificial layers 182 and 184 may be removed and then to form the gate structure 160.

Next, similar to those described above with reference to FIGS. 10J and 10K, a portion of the gate dielectric layer 162, the gate electrode 165, and the dummy active region 105D may be removed to form an opening OP'. For example, in the present example embodiment, unlike in the example embodiment described above with reference to FIGS. 10J and 10K, the opening OP' may be formed by removing not only a portion of the gate electrode 165, but also of the dummy active region 105D, and it may be formed to have a shape having a step with a narrower step. The depth of the dummy active region 105D removed in the present step may be the same as or different from the depth of the dummy active region 105 removed on both sides of the first and second sacrificial layers 182 and 184 in the above-described step with reference to FIG. 11C.

Figure 11F:
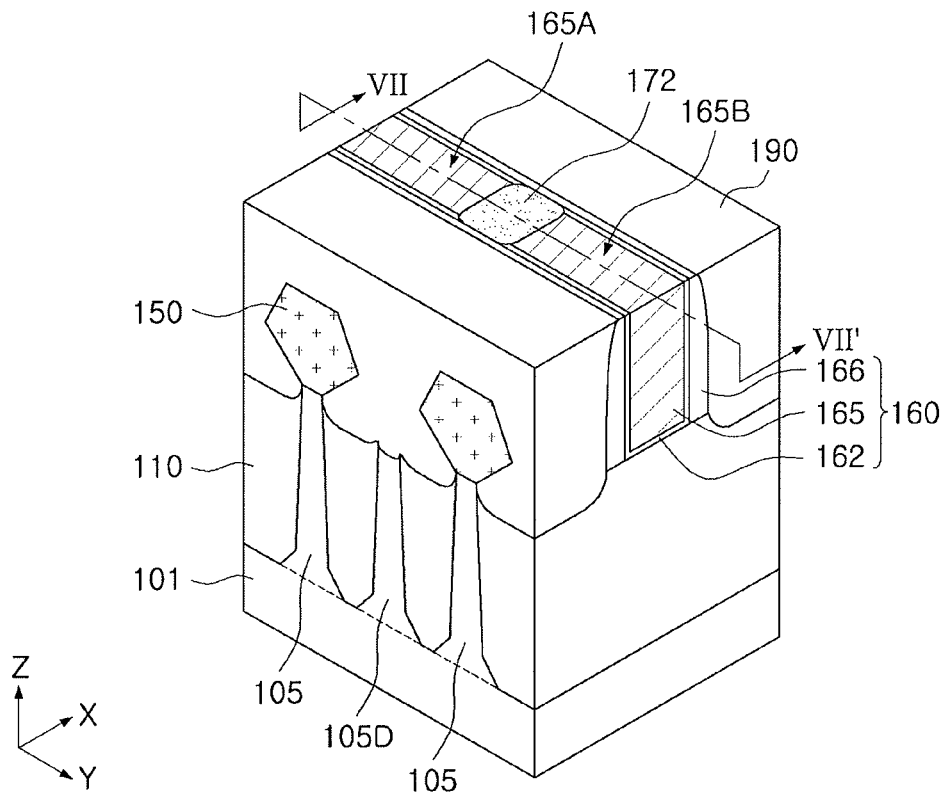
Figure 11G:
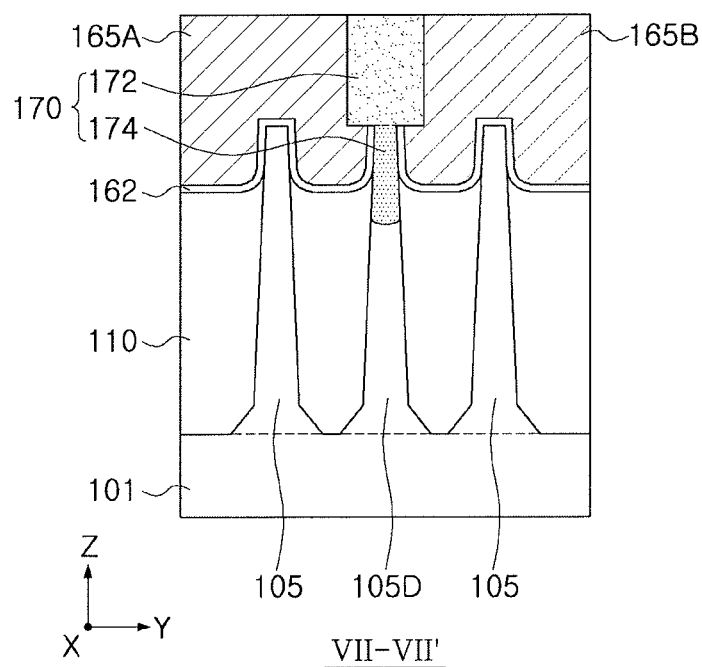

Referring to FIGS. 11F and 11G, the gate separation portion 170 may be formed by filling an insulating material in an opening OP' to form the first and second gate separation layers 172 and 174 of the gate separation portion 170. FIG. 11G illustrates a cross-section taken along cross-sectional line VII-VII' of FIG. 11F.

The first and second gate separation layers 172 and 174 may be formed by filing the opening OP' with an insulating material, e.g., silicon nitride or the like. In an implementation, the first and second gate separation layers 172 and 174 may be formed through one deposition step, and may be formed of the same material, and may have a coupled, connected, or integral shape.

Thereafter, contact plugs 195 may be further formed, as described above with reference to FIG. 10L.

Figure 12A:
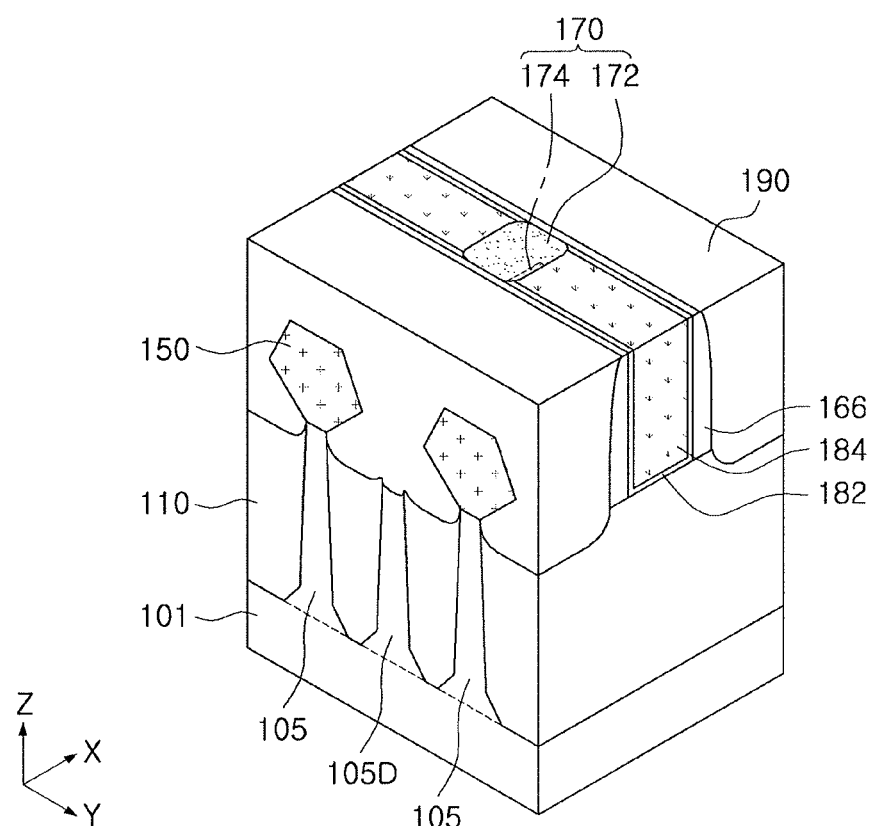
FIGS. 12A to 12C illustrate views of stages in a manufacturing method of a semiconductor device according to a process order according to example embodiments.
Figure 12B:
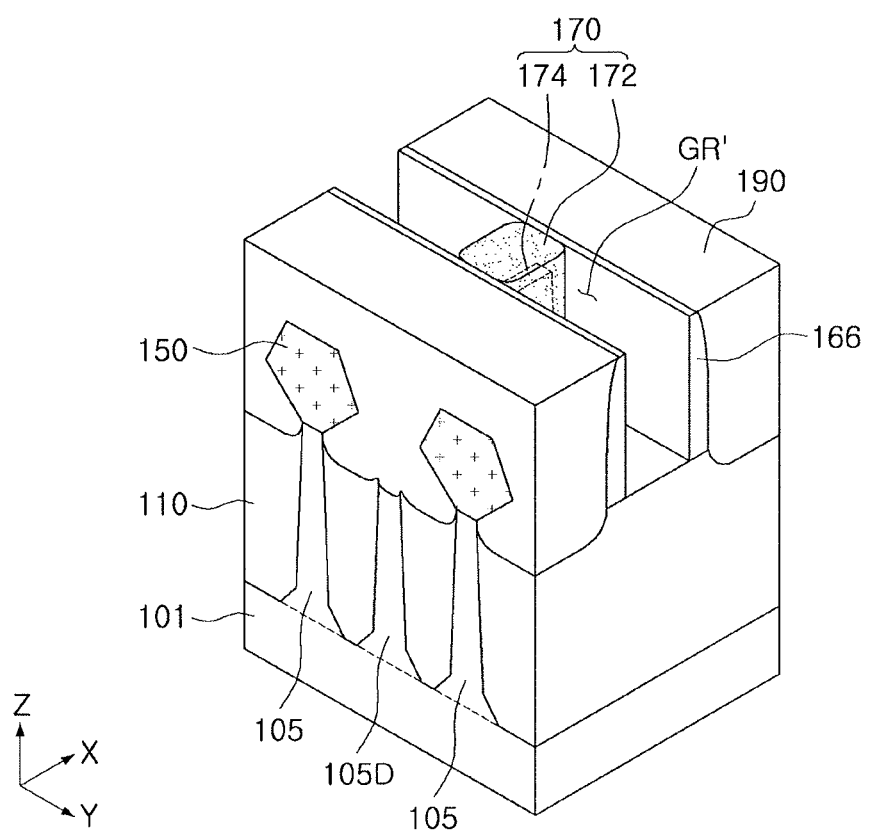
Figure 12C:
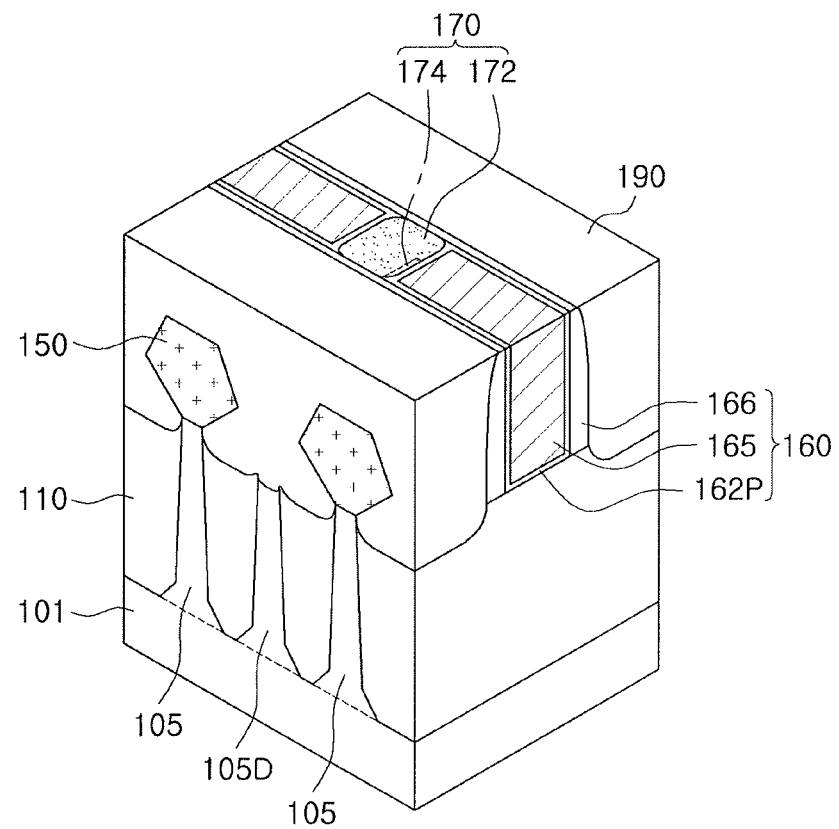

FIGS. 12A to 12C illustrate views of stages in a manufacturing method of a semiconductor device according to example embodiments according to a process order. FIGS. 12A to 12C, an example embodiment of a manufacturing method of the semiconductor device of FIGS. 5A and 5B will be described.

Referring to FIG. 12A, active regions 105, a device isolation layer 110, a dummy active region 105D, a second gate separation layer 174, first and second sacrificial layers 182 and 184, a gate spacer layer 166, source/drain regions 150, and an interlayer insulating layer 190 may be formed, and then, a first gate separation layer 172 may be formed.

First, as described with reference to FIGS. 10A to 10G, the active regions 105, the device isolation layer 110, the dummy active region 105D, the second gate separation layer 174, the gate spacer layer 166, and the source/drain regions 150 may be formed.

Next, the interlayer insulating layer 190 may be formed on the source/drain regions 150, a portion of the first and second sacrificial layers 182 and 184 may be removed to form an opening, and the second gate separation layer 174 may be formed by filling the opening to form the gate separation portion 170. In the present embodiment, unlike the example embodiment described above with reference to FIGS. 10A to 10L, a portion of the first and second sacrificial layers 182 and 184, rather than the gate dielectric layer 162 and the gate electrode 165, may be removed to form the second gate separation layer 174.

Referring to FIG. 12B, the first and second sacrificial layers 182 and 184, the sacrificial gate structure, may then be removed.

The first and second sacrificial layers 182 and 184 may be selectively removed with respect to the active regions 105 in the lower portion, the device isolation layer 110, and the gate separation portion 170, a gate region GR' exposing the active regions 105, the device isolation layer 110, and the gate separation portion 170 may be formed.

Referring to FIG. 12C, a gate dielectric layer 162 and a gate electrode 165 may be formed in a gate region GR' to finally form the gate structure 160.

The gate dielectric layer 162 and the gate electrode 165 may be formed in a state in the gate separation portion 170 has already been formed, and the gate dielectric layer 162 may also be formed on the side surface (e.g., surface facing in the Y direction) of the first gate separation layer 172.

Thereafter, contact plugs 195 may be further formed as described above with reference to FIG. 10L.

Figure 13:
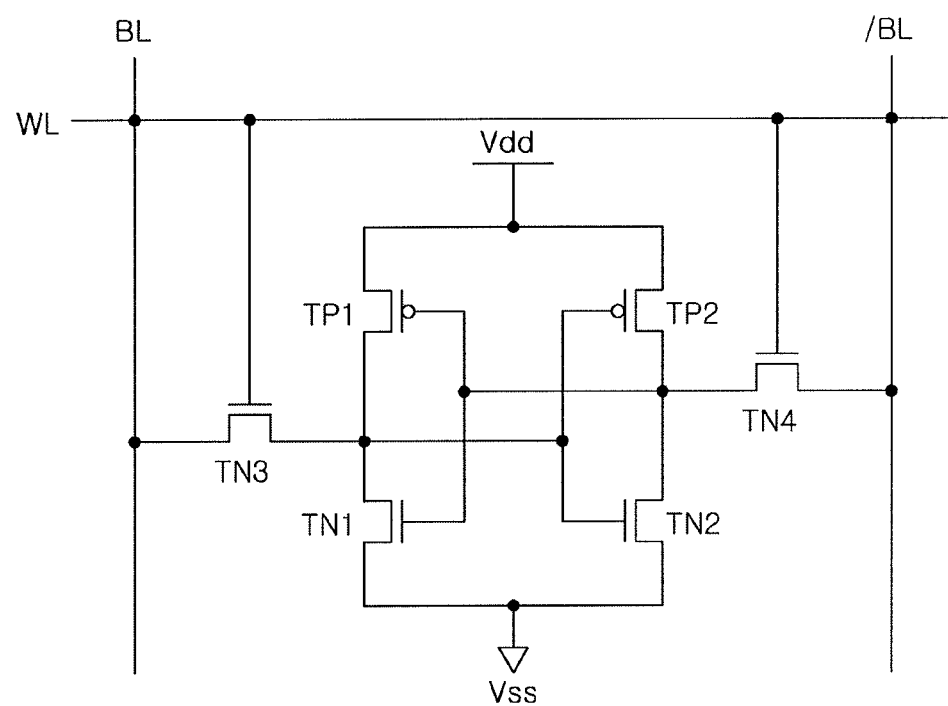
FIG. 13 illustrates a circuit diagram of an SRAM cell including a semiconductor device according to example embodiments.

FIG. 13 illustrates a circuit diagram of an SRAM cell including a semiconductor device according to example embodiments.

Referring to FIG. 13, one cell in the SRAM device may include first and second driving transistors TN1 and TN2, first and second load transistors TP1 and TP2, and first and second access transistors TN3 and TN4. In this case, a source of the first and second driving transistors TN1 and TN2 may be connected to a ground voltage line Vss, and a source of the first and second load transistors TP1 and TP2 may be connected to a power voltage line Vdd.

A first driving transistor TN1 formed of an NMOS transistor and a second load transistor TP1 formed of a PMOS transistor may constitute a first inverter, and a second driving transistor TN2 formed of an NMOS transistor and a second load transistor TP2 formed of a PMOS transistor may constitute a second inverter. At least portions of the first and second driving transistors TN1 and TN2, the first and second load transistors TP1 and TP2, and the first and second access transistors TN3 and TN4 may include a semiconductor device according to various example embodiments as described above with reference to FIGS. 1 to 9B.

Output terminals of the first and second inverters may be connected to the sources of the first access transistor TN3 and the second access transistor TN4. In addition, the first and second inverters may be connected to each other such that an input terminal and an output terminal intersect each other to configure one latch circuit. Drains of the first and second access transistors TN3 and TN4 may be connected to first and second bit lines BL and /BL, respectively.

Figure 14:
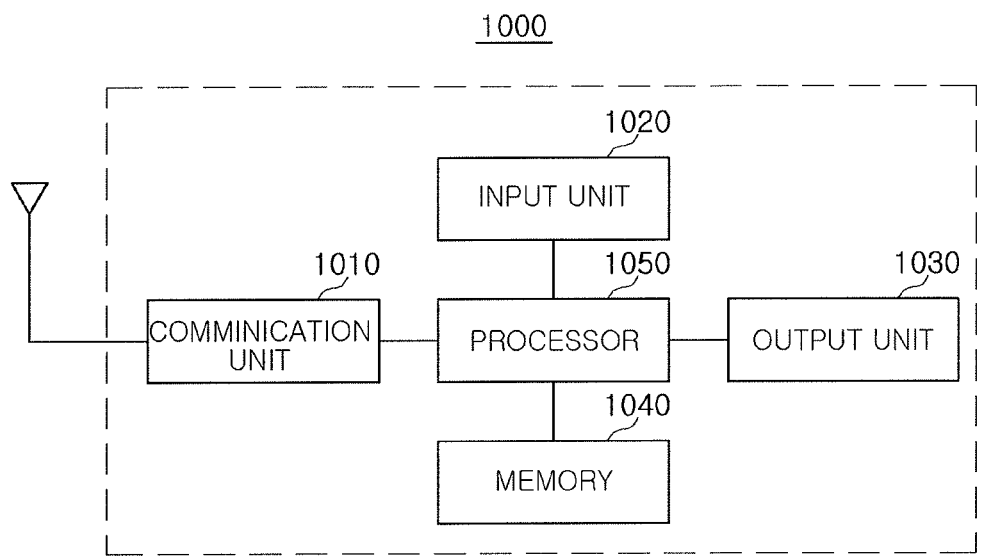
FIG. 14 illustrates a diagram of an electronic apparatus including a semiconductor device according to example embodiments.

FIG. 14 illustrates a diagram of an electronic apparatus including a semiconductor device according to example embodiments. Referring to FIG. 14, an electronic apparatus 1000 according to an example embodiment may include a communication unit 1010, an input unit 1020, an output unit 1030, a memory 1040, and a processor 1050.

The communication unit 1010 may include a wired/wireless communication module, e.g., a wireless internet module, a near field communications module, a global positioning system (GPS) module, a mobile communication module, and the like. The wired/wireless communication module included in the communication unit 1010 may transmit and receive data by being connected to external communication networks according to various communication standards.

The input unit 1020 may be provided as a module provided for users to control operations of the electronic apparatus 1000, and may include a mechanical switch, a touchscreen, a voice recognition module, and the like. In addition, the input unit 1020 may also include a finger mouse device or a mouse operated using a trackball, a laser pointer, or the like. The input unit 1020 may further include various sensor modules by which users may input data.

The output unit 1030 may output information processed in the electronic device 1000 in the form of audio or video, while the memory 1040 may store a program, data, or the like, to process and control the processor 1050. The processor 1050 may store as well as output data by sending a command to the memory 1040 according to required operations.

The memory 1040 may communicate with the processor 1050 through an interface embedded in the electronic apparatus 1000 or a separate interface. In a case in which the memory 1040 communicates with the processor 1050 through a separate interface, the processor 1050 may store data in or output data from the memory 1040 through various interface standards, such as SD, SDHC, SDXC, MICRO SD, USB, and the like.

The processor 1050 may control operations of respective units included in the electronic apparatus 1000. The processor 1050 may perform control and process operations relating to voice calls, video calls, data communications, and the like, or may perform control and process operations to play and manage multimedia. In addition, the processor 1050 may process inputs sent through the input unit 1020 by a user, and may output the results through the output unit 1030. Furthermore, the processor 1050 may store data required to control operations of the electronic device 1000 in the memory 1040 or output the data therefrom, as described above. At least one of the processor 1050 and the memory 1040 may include semiconductor device according to various example embodiments, as described above.

Figure 15:
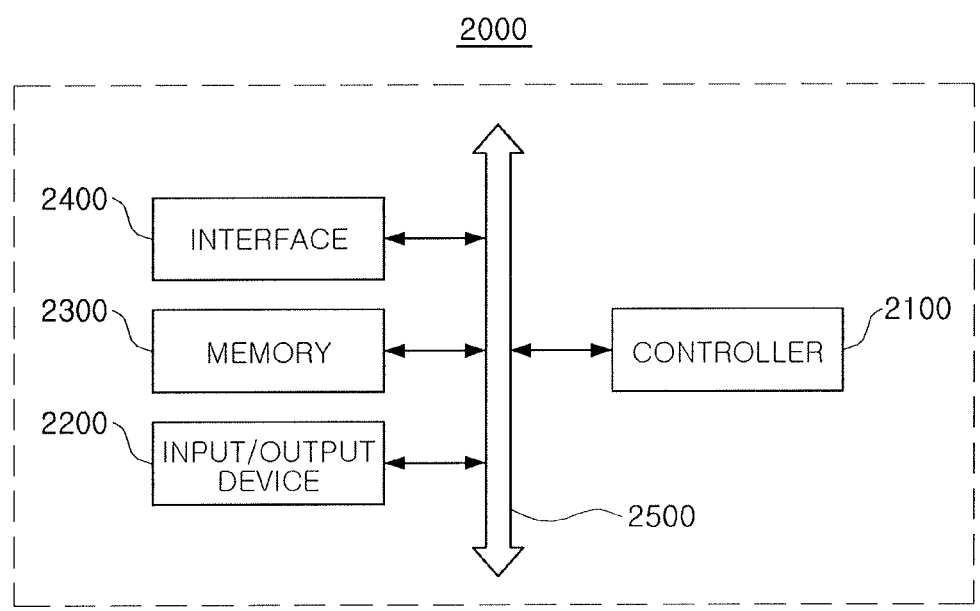
FIG. 15 illustrates a schematic diagram of a system including a semiconductor device according to example embodiments.

FIG. 15 illustrates a schematic diagram of a system including a semiconductor device, according to example embodiments.

Referring to FIG. 15, a system 2000 may include a controller 2100, an input/output device 2200, a memory 2300, and an interface 2400. The system 2000 may be a system transmitting or receiving a mobile system or information. The mobile system may be a PDA, a portable computer, a web tablet, a wireless phone, a mobile phone, a digital music player, or a memory card.

The controller 2100 may execute a program and control the system 2000. The controller 2100 may be, e.g., a microprocessor, a digital signal processor, a microcontroller, or a similar device as described above.

The input/output device 2200 may be used to input or output data of the system 2000. The system 2000 may be connected to an external device, e.g., a personal computer or network, using the input/output device 2200 to exchange data with the external device. The input/output device 2200 may be, for example, a keypad, a keyboard, or a display.

The memory 2300 may store code and/or data for the operation of the controller 2100, and/or may store the processed data in the controller 2100.

An interface 2400 may be a data transmission path between the system 2000 and other external devices. The controller 2100, the input/output device 2200, the memory 2300, and the interface 2400 may communicate with each other via a bus 2500.

At least one of the controller 2100 or the memory 2300 may include a semiconductor device according to various example embodiments as described above with reference to FIGS. 1 to 5 and FIGS. 12 to 15B.

By way of summation and review, to help overcome limitations of element characteristics of a planar MOSFET, efforts have been made to develop a semiconductor device including a FinFET having a channel having a three-dimensional structure.

One or more embodiments may provide a semiconductor device having improved reliability.

As set forth above, by forming a gate separation layer for separating a gate electrode into a plurality of layers being stacked vertically, a semiconductor device with improved reliability may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming active regions extending in a first direction on a substrate by removing a portion of the substrate;
   forming a dummy active region by removing an upper portion of a first active region among the active regions;
   forming a second gate separation layer on the dummy active region;
   forming a sacrificial structure extending in a second direction crossing the first direction, on the active regions and the second gate separation layer;
   removing a portion of the second gate separation layer from outside of the sacrificial structure;

forming source/drain regions on the active regions, at both sides of the sacrificial structure;

forming an interlayer insulating layer covering the source/drain regions;

removing the sacrificial structure and forming a gate structure in a region in which the sacrificial structure is removed;

forming an opening by removing a portion of the gate structure to expose the second gate separation layer; and forming a first gate separation layer by filling the opening with an insulating material.

2. The method of claim 1, wherein forming the second gate separation layer includes filling a region in which the upper portion of the first active region is removed with an insulating material.

3. The method of claim 1, further comprising forming a device isolation layer by filling an insulating material between the active regions, after forming the active regions, wherein forming the dummy active region includes:

forming a mask layer exposing the first active region, on the active regions and the device isolation layer; and forming a recessed region of the first active region by selectively removing the upper portion of the first active region with respect to the device isolation layer.

4. The method of claim 3, further comprising partially removing the device isolation layer such that the active regions and the second gate separation layer protrude from the device isolation layer.

5. The method of claim 1, wherein in the forming the opening, the opening separates the gate structure into a first gate structure and a second gate structure.

6. The method of claim 1, wherein the second gate separation layer, together with the dummy active region, has a substantially same shape as an active region of the active regions.

7. The method of claim 1, wherein the first gate separation layer and the second gate separation layer have different widths in the second direction.

8. The method of claim 7, wherein a bending portion according to a width difference is formed between the first gate separation layer and the second gate separation layer.

9. The method of claim 1, wherein the second gate separation layer is between the first gate separation layer and the dummy active region.

10. The method of claim 1, wherein an upper surface of the second gate separation layer is at a substantially same height level as a height level of upper surfaces of the active regions under the gate structure.

11. The method of claim 1, wherein an upper surface of the first gate separation layer is at a substantially same height level as a height level of an upper surface of the gate structure.

12. The method of claim 1, wherein forming the gate structure includes:

forming a gate dielectric layer; and forming a gate electrode.

13. The method of claim 12, wherein the gate dielectric layer covers at least a portion of a side surface of the second gate separation layer.

14. A method of manufacturing a semiconductor device, the method comprising:

forming active regions extending in a first direction on a substrate by removing a portion of the substrate;

forming a sacrificial structure extending in a second direction crossing the first direction, on the active regions;

forming a dummy active region by removing an upper portion of a first active region among the active regions from outside of the sacrificial structure;

forming source/drain regions on the active regions, at both sides of the sacrificial structure;

forming an interlayer insulating layer covering the source/drain regions;

removing the sacrificial structure and forming a gate structure in a region in which the sacrificial structure is removed;

forming an opening by removing a portion of the gate structure and a portion of the dummy active region under the gate structure; and forming a gate separation portion by filling the opening with an insulating material.

15. The method of claim 14, wherein the gate separation portion includes:

a first gate separation layer at an upper portion thereof; and a second gate separation layer below the first gate separation layer.

16. The method of claim 15, wherein a width of the second gate separation layer in the second direction is narrower than a width of the first gate separation layer in the second direction.

17. The method of claim 15, wherein the second gate separation layer, together with the dummy active region, has a substantially same shape as an active region of the active regions.

18. A method of manufacturing a semiconductor device, the method comprising:

forming active regions extending in a first direction on a substrate by removing a portion of the substrate;

forming a dummy active region by removing an upper portion of a first active region among the active regions;

forming a second gate separation layer on the dummy active region;

forming a sacrificial structure extending in a second direction crossing the first direction, on the active regions;

removing a portion of the second gate separation layer from outside of the sacrificial structure such that the second gate separation layer remains vertically under the sacrificial structure;

forming source/drain regions on the active regions, at both sides of the sacrificial structure;

forming an opening by removing a portion of the sacrificial structure to expose the second gate separation layer;

forming a first gate separation layer by filling the opening with an insulating material; and removing the sacrificial structure and forming a gate structure in a region in which the sacrificial structure is removed.

19. The method of claim 18, wherein:

forming the gate structure includes:

forming a gate dielectric layer; and forming a gate electrode, and the gate dielectric layer extends from a side surface of the second gate separation layer to cover a side surface of the first gate separation layer.

20. The method of claim 18, wherein the first gate separation layer is formed on an upper surface of the second gate separation layer to contact the upper surface of the second gate separation layer.

* * * * *